United States Patent
Murali et al.

(10) Patent No.: US 12,057,829 B2
(45) Date of Patent: Aug. 6, 2024

(54) BIAS CURRENT RECEIVER WITH SELECTIVE COUPLING CIRCUIT

(71) Applicant: QUALCOMM Incorporated, San Diego, CA (US)

(72) Inventors: Abhinav Murali, Bangalore (IN); Pradeep Kumar Sana, Bangalore (IN); Sajin Mohamad, San Diego, CA (US); Harikrishna Chintarlapalli Reddy, Bengaluru (IN); Rakesh Kumar Sinha, Bangalore (IN); Jibu Varghese K, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 18/336,621

(22) Filed: Jun. 16, 2023

(65) Prior Publication Data
US 2023/0396248 A1  Dec. 7, 2023

Related U.S. Application Data

(63) Continuation of application No. 17/831,306, filed on Jun. 2, 2022, now Pat. No. 11,736,105.

(51) Int. Cl.
*H03K 17/687* (2006.01)
*H04B 1/40* (2015.01)

(52) U.S. Cl.
CPC ........... *H03K 17/6872* (2013.01); *H04B 1/40* (2013.01)

(58) Field of Classification Search
CPC ........................... H03K 17/6872; G05F 3/262
See application file for complete search history.

(56) References Cited

U.S. PATENT DOCUMENTS

| | | | |
|---|---|---|---|
| 5,940,322 A | 8/1999 | Atsumi | |
| 6,002,157 A | 12/1999 | Kozuka | |
| 6,404,275 B1 * | 6/2002 | Voldman | G05F 3/262 |
| | | | 327/538 |
| 7,176,740 B2 | 2/2007 | Tachibana et al. | |
| 9,641,141 B1 | 5/2017 | Zheng et al. | |
| 9,946,291 B2 | 4/2018 | Kim | |
| 11,736,105 B1 | 8/2023 | Murali | |
| 2011/0018621 A1 | 1/2011 | Butzmann | |
| 2014/0219002 A1 | 8/2014 | Lee et al. | |

OTHER PUBLICATIONS

International Search Report and Written Opinion—PCT/US2023/022863—ISA/EPO—Sep. 22, 2023.

* cited by examiner

*Primary Examiner* — Metasebia T Retebo
(74) *Attorney, Agent, or Firm* — Loza & Loza, LLP

(57) ABSTRACT

An integrated circuit (IC), including: a current mirror, including: a first field effect transistor (FET) including a first drain, a first gate, and a first source, wherein the first source is coupled to a first voltage rail; and a second FET including a second drain, a second gate, and a second source, wherein the second gate is coupled to the first gate of the first FET, and the second source is coupled to the first voltage rail; and a selective coupling circuit configured to selectively couple the first drain of the first FET to the first and second gates of the first and second FETs based on a voltage at the first drain of the first FET.

24 Claims, 7 Drawing Sheets

BIAS CURRENT RECEIVER WITH SELECTIVE COUPLING CIRCUIT

CROSS-REFERENCE TO RELATED APPLICATIONS

The present Application for Patent is a Continuation of U.S. Non-Provisional application Ser. No. 17/831,306, filed Jun. 2, 2022, and assigned to the assignee hereof and hereby expressly incorporated by reference herein as if fully set forth below and for all applicable purposes.

FIELD

Aspects of the present disclosure relate generally to bias current receivers, and in particular, to a bias current receiver with a selective coupling circuit.

BACKGROUND

An integrated circuit (IC) typically includes a number of functional cores that perform various operations. In some cases, the functional cores may each include a bias current receiver that receives a reference current, and generates therefrom a set of one or more bias currents for use in effectuating the various operations of the functional core. The reference current may be generated by a process-voltage-temperature (PVT) stable (e.g., bandgap) current generator. During manufacturing of the IC, a metal trace may be formed to couple the reference current generator to a current mirror as part of the bias current receiver. If the metal trace is coupled directly to the gates of the current mirror field effect transistors (FETs), damage to the FETs may occur as a result of gate antenna effect. That is, charges accumulated on the metal trace during IC processing, may discharge through the gate oxide/insulator of the FET, which may cause the FET to fail.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an integrated circuit (IC). The IC includes a current mirror, including: a first field effect transistor (FET) including a first drain, a first gate, and a first source, wherein the first source is coupled to a first voltage rail; and a second FET including a second drain, a second gate, and a second source, wherein the second gate is coupled to the first gate of the first FET, and the second source is coupled to the first voltage rail; and a selective coupling circuit configured to selectively couple the first drain of the first FET to the first and second gates of the first and second FETs based on a voltage at the first drain of the first FET.

Another aspect of the disclosure relates to a method. The method includes selectively coupling a first drain of a first field effect transistor (FET) to a first gate of the first FET and a second gate of a second FET to effectuate a current mirror operation of the first and second FETs in response to a voltage at the first drain of the first FET.

Another aspect of the disclosure relates to an apparatus. The apparatus includes a first field effect transistor (FET); a second FET; and means for selectively coupling a first drain of the first FET to a first gate of the first FET and a second gate of the second FET to effectuate a current mirror operation of the first and second FETs in response to a voltage at the first drain of the first FET.

Another aspect of the disclosure relates to a wireless communication device. The wireless communication device includes a reference current generator; a bias current receiver coupled to the reference current generator, wherein the bias current receiver includes: a current mirror, including: a first field effect transistor (FET) including a first drain, a first gate, and a first source, wherein the first source is coupled to a first voltage rail; and a second FET including a second drain, a second gate, and a second source, wherein the second gate is coupled to the first gate of the first FET, and the second source is coupled to the first voltage rail, and a selective coupling circuit configured to selectively couple the first drain of the first FET to the first and second gates of the first and second FETs based on a voltage at the first drain of the first FET; and one or more signal processing cores coupled to the bias current receiver.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

An integrated circuit (IC) typically includes a number of functional cores or circuits that perform various operations. As some examples, an IC may include a display serial interface (DSI), a serial data bus interface, a double data rate (DDR) memory interface, a physical controller messaging interface, and/or others. In some cases, these functional cores or circuits may incorporate a bias current receiver that receives a reference current, and generates therefrom a set of one or more bias currents for use in effectuating the various operations of the functional cores or circuits. The reference current may be generated by a process-voltage-temperature (PVT) stable (e.g., bandgap) current generator.

Figure 1:
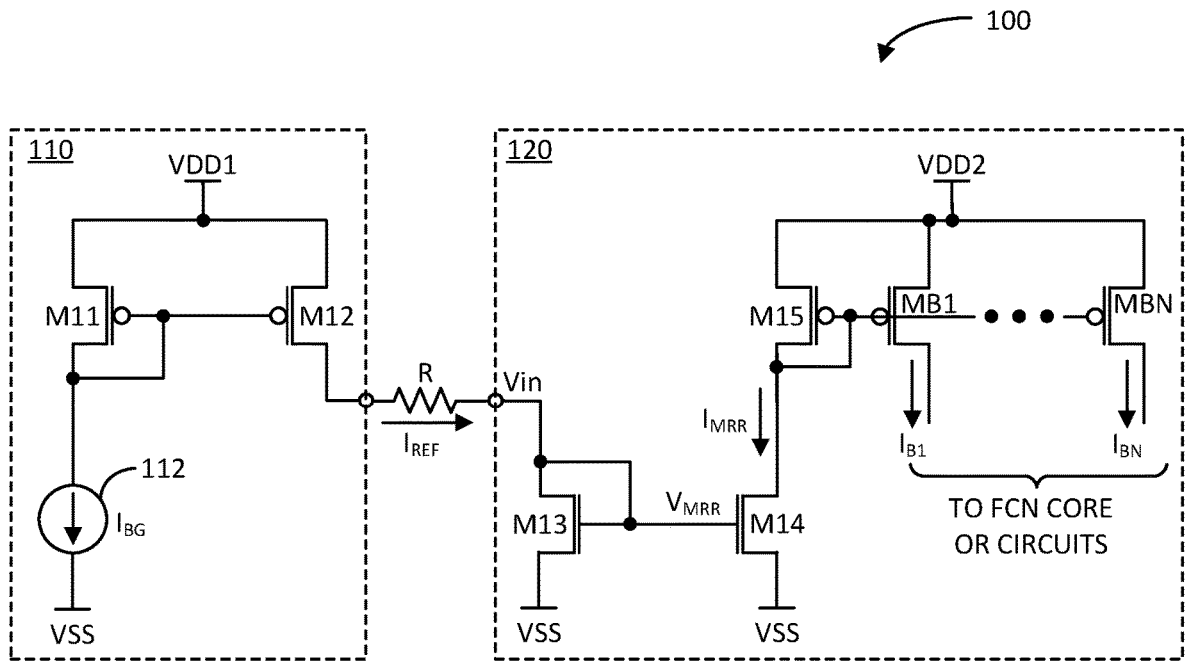
FIG. 1 illustrates a schematic diagram of an example integrated circuit (IC) including an example bias current receiver in accordance with an aspect of the disclosure.

FIG. 1 illustrates a schematic diagram of an example integrated circuit (IC) 100 in accordance with an aspect of the disclosure. The IC 100 includes a reference current generator 110 and a bias current receiver 120. The reference current generator 110 is configured to generate a reference current $I_{REF}$. The bias current receiver 120 is configured to generate a set of one or more bias currents $I_{B1}$ to $I_{BN}$ related to or based on the reference current $I_{REF}$. The bias current receiver 120 may pertain to or is co-located with one or more functional cores or circuits that use the set of one or more bias currents $I_{B1}$ to $I_{BN}$ for performing their operations.

In particular, the reference current generator 110 includes a first p-channel metal oxide semiconductor field effect transistor (PMOS FET) M11 coupled in series with a current source 112 (e.g., a PVT stable or bandgap current source) between a first upper voltage rail VDD1 and a lower voltage rail VSS (e.g., ground). That is, the PMOS FET M11 includes a source coupled to the first upper voltage rail VDD1, and a gate and a drain coupled together. The current source 112 is coupled between the gate and drain of the PMOS FET M11 and the lower voltage rail VSS. The current source 112 is configured to generate a PVT-stable or bandgap current $I_{BG}$.

The reference current generator 110 further includes a second PMOS FET M12 including a source coupled to the first upper voltage rail VDD1, a gate coupled to the gate and drain of the first PMOS FET M11 to form a current mirror, and a drain serving as a current output of the reference current generator 110. As such, the reference current generator 110 is configured to generate the reference current $I_{REF}$ through PMOS FET M12, wherein the reference current $I_{REF}$ is related to or based on the current $I_{BG}$ generated by the current source 112 (e.g., based on a current gain $(I_{REF}/I_{BG})$ of the current mirror). The current gain $I_{REF}/I_{BG}$ may be based on a ratio of a channel width to length ratio $(W/L_2)$ of the second PMOS FET M12 to a channel width to length ratio $(W/L_1)$ of the first PMOS FET M11. The reference current $I_{REF}$ is provided to the bias current receiver 120 via a metal trace, which is represented as a resistor R.

The bias current receiver 120, in turn, includes a first n-channel metal oxide semiconductor field effect transistor (NMOS FET) M13 coupled between a current input (Vin) of the bias current receiver 120 and the lower voltage rail VSS. As used herein, the term (Vin) in parenthesis refers to the current input, and the term Vin without the parenthesis refers to the voltage at the current input. As depicted, the metal trace R is coupled between the output of the reference current generator 110 and the current input (Vin) of the bias current receiver 120. The first NMOS FET M13 includes a drain coupled to or serving as the current input (Vin) of the bias current receiver 120, a gate coupled to its drain, and a source coupled to the lower voltage rail VSS.

The bias current receiver 120 further includes a PMOS FET M15 coupled in series with a second NMOS FET M14 between a second upper voltage rail VDD2 and the lower voltage rail VSS. That is, the PMOS FET M15 includes a source coupled to the second upper voltage rail VDD2, and a gate and a drain coupled together. The second NMOS FET M14 includes a drain coupled to the gate and drain of the PMOS FET M15, a gate coupled to the gate and drain of the first NMOS FET M13, and a source coupled to the lower voltage rail VSS. In such configuration, the first and second NMOS FETs M13 and M14 form a current mirror to generate a mirrored current $I_{MMR}$ through the PMOS FET M15 and the second NMOS FET M14 that is related to or based on the reference current $I_{REF}$ (e.g., based on a current gain $(I_{MRR}/I_{REF})$ of the current mirror). That is, the received reference current $I_{REF}$ generates a voltage $V_{MRR}$ at the gates of NMOS FETs M13 and M14 that produces the mirrored current $I_{MMR}$ through the NMOS FET M14. The current gain $I_{MRR}/I_{REF}$ may be based on a ratio of the channel width to length ratio $(W/L_4)$ of the second NMOS FET M14 to a channel width to length ratio $(W/L_3)$ of the first NMOS FET M13.

The bias current receiver 120 may further include a set of one or more PMOS FETs MB1 to MBN configured to generate a set of one or more bias currents $I_{B1}$ to $I_{BN}$ related to or based on the mirrored current $I_{MMR}$, respectively (where N may be a positive integer of one (1) or more). That is, the set of one or more PMOS FETs MB1 to MBN includes sources coupled to the second upper voltage rail VDD2, gates coupled to the gate/drain of the PMOS FET M15, and drains coupled to one or more functional cores or circuits requiring the corresponding bias currents $I_{B1}$ to $I_{BN}$ to effectuate their operations.

In such configuration, the PMOS FET M15 and PMOS FETs MB1 to MBN form a current mirror to generate the set of one or more bias currents $I_{B1}$ to $I_{BN}$ through the set of one or more PMOS FETs MB1 to MBN that are related to or based on the mirrored current $I_{MRR}$ (e.g., based on a set of one or more current gains ($I_{B1}/I_{MRR}$ to $I_{BN}/I_{MRR}$) of the current mirror), respectively. The set of one or more current gains $I_{B1}/I_{MRR}$ to $I_{BN}/I_{MRR}$ may be based on a set of one or more ratios of the channel width to length ratios $W/L_{B1}$ to $W/L_{BN}$ of the set of one or more second PMOS FETs MB1 to MBN to a channel width to length ratio ($W/L_5$) of the PMOS FET M15, respectively. The set of one or more current gains may be used to effectively multiply and/or divide the reference current $I_{REF}$ to generate the set of one or more bias currents $I_{B1}$ to $I_{BN}$.

In IC 100, the metal trace R coupling the reference current generator 110 to the bias current receiver 120 is directly coupled to the gates of NMOS FETs M13 and M14. As such, the NMOS FETs M13 and M14 may be susceptible to gate antenna effect. That is, during manufacturing of the IC 100, and in particular, the plasma etching to form the metal trace R, significant electrical charges may accumulate on the metal trace R, especially if the metal trace R is relatively long (e.g., 10-15 millimeters (mm)). As the gate oxide or insulator of the NMOS FETs M13 and M14 may be relatively thin, the electrical charges on the metal trace R may discharge to the lower voltage rail VSS via the gate oxide or insulator of the NMOS FETs M13 and M14. This discharge can cause damage or failure of the NMOS FETs M13 and M14, resulting in decreased yield in the manufacturing of the IC 100.

Figure 2:
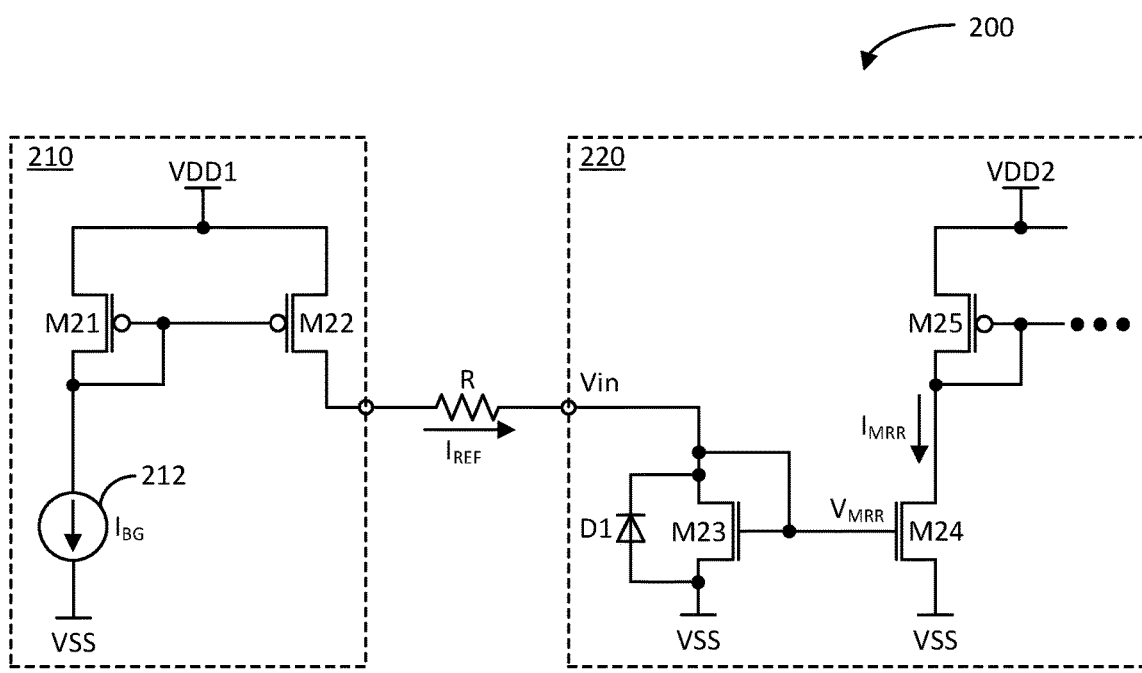
FIG. 2 illustrates a schematic diagram of another example integrated circuit (IC) including another example bias current receiver in accordance with another aspect of the disclosure.

FIG. 2 illustrates a schematic diagram of another example integrated circuit (IC) 200 including another example bias current receiver 220 in accordance with another aspect of the disclosure. The IC 200 is similar to that of IC 100 including a reference current generator 210 coupled to the bias current receiver 220 via a metal trace R.

Similarly, the reference current generator 210 includes first and second PMOS FETs M21 and M22, and a PVT-stable or bandgap current source 212 in the same configuration as the first and second PMOS FETs M11 and M12, and the PVT-stable or bandgap current source 112 of reference current generator 110. Also, in a similar manner, the bias current receiver 220 includes first and second NMOS FETs M23 and M24 and PMOS FET M25 in the same configuration as the first and second NMOS FETs M13 and M14 and PMOS FET M15 of bias current receiver 120. Although not explicitly shown, the bias current receiver 220 may include the set of one or more PMOS FETs MB1 to MBN coupled to the PMOS FET M25 in a current mirror configuration for generating the set of bias currents $I_{B1}$ to $I_{BN}$, respectively.

To address potential gate antenna effect, the bias current receiver 220 further includes a reverse bias diode D1 including a cathode coupled to the gates of the NMOS FETs M23 and M24 and an anode coupled to the lower voltage rail VSS. The reverse bias diode D1 provides a path for electrical charges that have accumulated on the metal trace R to discharge to the lower voltage rail VSS. As such, the electrical charges do not discharge via the thin gate oxide/insulator of the NMOS FETs M23 and M24; thereby, eliminating or reducing the likelihood of damage to the NMOS FETs M23 and M24. During normal operation of the IC 100, the reverse bias diode D1 does not turn on, and does not affect the operation of the IC 100. A drawback of such approach is that the reverse bias diode D1 occupies significant IC area, which is generally undesirable.

Figure 3:
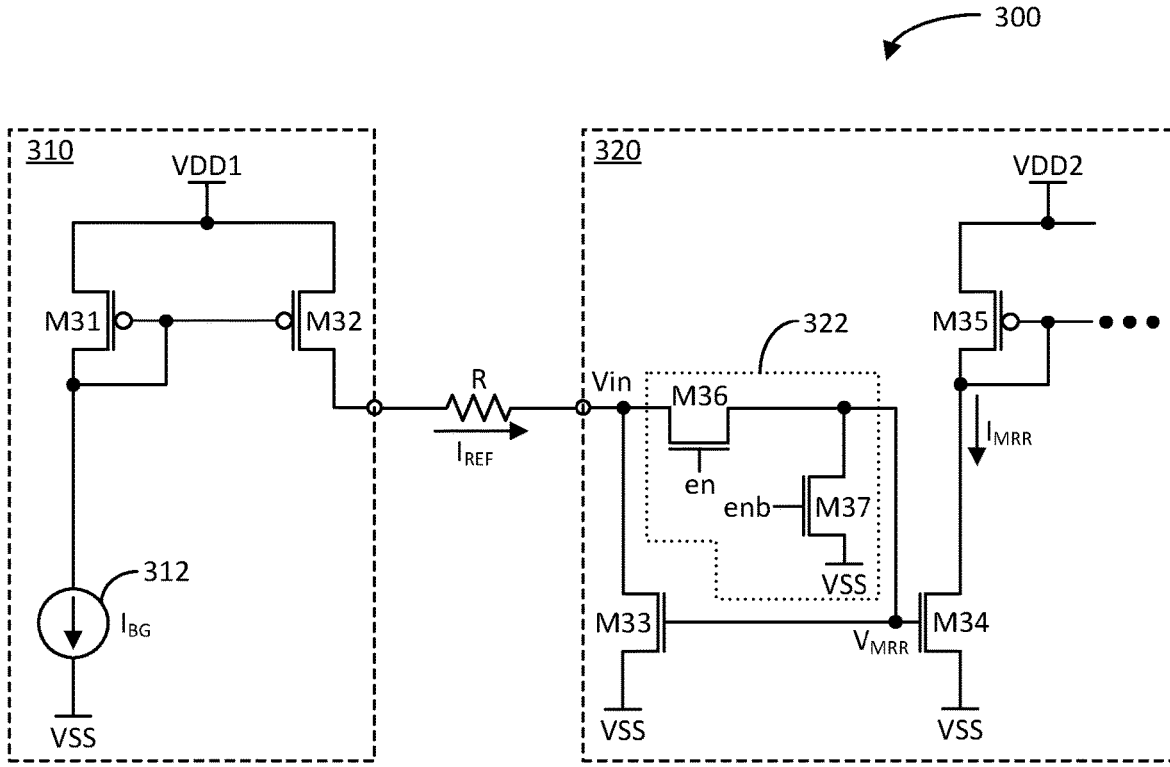
FIG. 3 illustrates a schematic diagram of another example integrated circuit (IC) including another example bias current receiver in accordance with another aspect of the disclosure.

FIG. 3 illustrates a schematic diagram of another example integrated circuit (IC) 300 including another example bias current receiver 320 in accordance with another aspect of the disclosure. The IC 300 is similar to that of IC 100 including a reference current generator 310 coupled to the bias current receiver 320 via a metal trace R.

Similarly, the reference current generator 310 includes first and second PMOS FETs M31 and M32, and a PVT-stable or bandgap current source 312 in the same configuration as the first and second PMOS FETs M11 and M12, and the PVT-stable or bandgap current source 112 of reference current generator 110. Also, similarly, the bias current receiver 320 includes first and second NMOS FETs M33 and M34 and PMOS FET M35 in a similar configuration as the first and second NMOS FETs M13 and M14 and PMOS FET M15 of bias current receiver 120, with the exception that the drain of NMOS FET M33 is not directly coupled to its gate, as discussed further herein. Although not explicitly shown, the bias current receiver 320 may include the set of one or more PMOS FETs MB1 to MBN coupled to the PMOS FET M35 in a current mirror configuration for generating the set of one or more bias currents $I_{B1}$ to $I_{BN}$, respectively.

To address potential gate antenna effect, the bias current receiver 320 further includes a selective coupling circuit 322 including an input coupled to the metal trace R (current input (Vin) of the bias current receiver 320) and an output coupled to the gates of the NMOS FETs M33 and M34. In this configuration, the gates of the NMOS FETs M33 and M34 are not directly coupled to the metal trace R; and thus, the NMOS FETs M33 and M34 are protected against gate antenna effect from the metal trace R. Also, in this example, there is no other gate antenna effect with regard to the metal trace R as it does not terminate at a gate of any device.

In this example, the selective coupling circuit 322 includes an NMOS FET M36 coupled between the current input (Vin) of the bias current receiver 320 (e.g., at which an end of the metal trace R is coupled) and the gates of the NMOS FETs M33 and M34. That is, the NMOS FET M36 includes a drain coupled to the current input (Vin) of the bias current receiver 320, a source coupled to the gates of the NMOS FETs M33 and M34, and a gate configured to receive a non-complementary enable signal (en). The selective coupling circuit 322 further includes an NMOS FET M37 coupled between the gates of the NMOS FETs M33 and M34 and the lower voltage rail VSS. That is, the NMOS FET M37 includes a drain coupled to the gates of the NMOS FETs M33 and M34, a source coupled to the lower voltage rail VSS, and a gate configured to receive a complementary enable signal (enb). The enable signals en and enb may be associated with enabling/disabling the bias current receiver 320 including the functional core or circuits to which the bias current receiver 320 is coupled and/or associated.

In operation, when the enable signals are asserted (e.g., en=high (H) (e.g., at substantially VDD2 potential) and enb=low (L) (e.g., at substantially VSS potential)), the NMOS FET M36 is turned on and the NMOS FET M37 is turned off. Accordingly, the turned-on NMOS FET M36 electrically couples the drain of the NMOS FET M33 to the gates of NMOS FETs M33 and M34; thereby, enabling the current mirror operation of the NMOS FETs M33 and M34 to effectuate the mirroring of the reference current $I_{REF}$ to generate the mirrored current $I_{MMR}$. The turned-off NMOS FET M37 electrically isolates the gates of NMOS FETs M33 and M34 from the lower voltage rail VSS.

When the enable signals are not asserted (deasserted) (e.g., en=L, enb=H), the NMOS FET M36 is turned off and the NMOS FET M37 is turned on. Accordingly, the turned-off NMOS FET M36 electrically isolates the drain of NMOS FET M33 from the gates of NMOS FETs M33 and M34, and the turned-on NMOS FET M37 electrically couples the gates of NMOS FETs M33 and M34 to the lower voltage rail VSS. This disables the current mirror operation of the NMOS FETs M33 and M34.

A drawback of the bias current receiver 320 is that when it is enabled (en=H, enb=L), the turned-on NMOS FET M36 may not be able to fully transfer the voltage Vin at the current input of the bias current receiver 320 to generate the voltage $V_{MRR}$ at the gates of NMOS FETs M33 and M34 to accurately effectuate the current mirror operation. There is generally a voltage drop of substantially a threshold voltage $V_T$ across the NMOS FET M36. As such, the voltage $V_{MRR}$ at the gates of NMOS FETs M33 and M34 is not at Vin to perform accurate current mirroring, but instead at Vin−$V_T$, which results in inaccurate mirroring of the reference current $I_{REF}$ to generate the mirrored current $I_{MRR}$. If the mirrored current $I_{MRR}$ is multiplied through the use of the current mirror coupled to the PMOS FET M35 to generate the one or more bias currents $I_{B1}$ to $I_{BN}$, the error in the current mirroring is increased by the multiplication factor.

Figure 4:
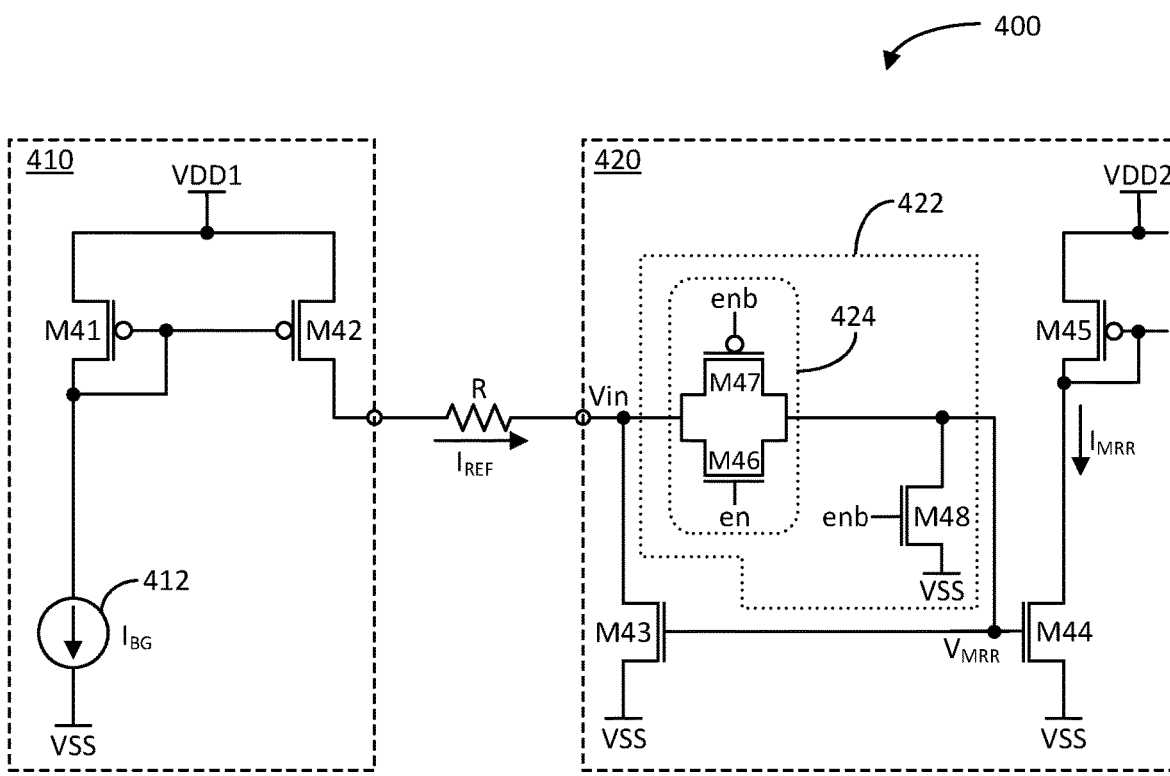
FIG. 4 illustrates a schematic diagram of another example integrated circuit (IC) including another example bias current receiver in accordance with another aspect of the disclosure.

FIG. 4 illustrates a schematic diagram of another example integrated circuit (IC) 400 including another example bias current receiver 420 in accordance with another aspect of the disclosure. The IC 400 is similar to that of IC 100 including a reference current generator 410 coupled to the bias current receiver 420 via a metal trace R.

Similarly, the reference current generator 410 includes first and second PMOS FETs M41 and M42, and a PVT-stable or bandgap current source 412 in the same configuration as the first and second PMOS FETs M11 and M12, and the PVT-stable or bandgap current source 112 of reference current generator 110. Also, similarly, the bias current receiver 420 includes first and second NMOS FETs M43 and M44 and PMOS FET M45 in a similar configuration as the first and second NMOS FETs M13 and M14 and PMOS FET M15 of bias current receiver 120, with the exception that the drain of NMOS FET M43 is not directly coupled to its gate, as discussed further herein. Although not explicitly shown, the bias current receiver 420 may include the set of one or more PMOS FETs MB1 to MBN coupled to the PMOS FET M45 in a current mirror configuration for generating the set of one or more bias currents $I_{B1}$ to $I_{BN}$, respectively.

To address potential gate antenna effect, the bias current receiver 420 further includes a selective coupling circuit 422 including an input coupled to the metal trace R (current input (Vin) of the bias current receiver 420) and an output coupled to the gates of the NMOS FETs M43 and M44. In this configuration, the gates of the NMOS FETs M43 and M44 are not directly coupled to the metal trace R; and thus, the NMOS FETs M43 and M44 are protected against gate antenna effect from the metal trace R. Also, in this example, there is no other gate antenna effect with regard to the metal trace R as it does not terminate at a gate of any device.

In this example, the selective coupling circuit 422 includes a transmission gate 424 (including parallel-coupled NMOS FET M46 and PMOS FET M47) coupled between the current input (Vin) of the bias current receiver 420 (e.g., at which an end of the metal trace R is coupled) and the gates of the NMOS FETs M43 and M44. That is, the NMOS FET M46 of the transmission gate 424 includes a drain coupled to the current input (Vin) of the bias current receiver 420, a source coupled to the gates of the NMOS FETs M43 and M44, and a gate configured to receive a non-complementary enable signal (en). The PMOS FET M47 of the transmission gate 424 includes a source coupled to the current input (Vin) of the bias current receiver 420, a drain coupled to the gates of the NMOS FETs M43 and M44, and a gate configured to receive a complementary enable signal (enb).

The selective coupling circuit 422 further includes an NMOS FET M48 coupled between the gates of the NMOS FETs M43 and M44 and the lower voltage rail VSS. That is, the NMOS FET M48 includes a drain coupled to the gates of the NMOS FETs M43 and M44, a source coupled to the lower voltage rail VSS, and a gate configured to receive the complementary enable signal enb. The enable signals en and enb may be associated with enabling/disabling the bias current receiver 420 including the functional core or circuits to which the bias current receiver 420 is coupled and/or associated.

In operation, when the enable signals are asserted (e.g., en=H, enb=L), the transmission gate 424 is turned on and the NMOS FET M48 is turned off. Accordingly, the turned-on transmission gate 424 electrically couples the drain of the NMOS FET M43 to the gates of NMOS FETs M43 and M44; thereby, enabling the current mirror operation of the NMOS FETs M43 and M44 to effectuate the mirroring of the reference current $I_{REF}$ to generate the mirrored current $I_{MMR}$. The turned-off NMOS FET M48 electrically isolates the gates of NMOS FETs M43 and M44 from the lower voltage rail VSS.

When the enable signals en and enb are deasserted (e.g., en=L, enb=H), the transmission gate 424 is turned off and the NMOS FET M48 is turned on. Accordingly, the turned-off transmission gate 424 electrically isolates the drain of NMOS FET M43 from the gates of NMOS FETs M43 and M44, and the turned-on NMOS FET M48 electrically couples the gates of NMOS FETs M43 and M44 to the lower voltage rail VSS. This disables the current mirror operation of the NMOS FETs M43 and M44.

A drawback of the bias current receiver 420 is that leakage current may result when the bias current receiver 420 is disabled (e.g., en=L, enb=H) due to the fact that the PMOS FET M47 of the transmission gate 424 may not be fully turned off due to difference in the voltages domains (VDD1 versus VDD2) under which the reference current generator 410 and the bias current receiver 420 operate. For example, the supply voltage at the upper voltage rail VDD1 of the reference current generator 410 may be at 1.2 Volts (V) and the supply voltage at the upper voltage rail VDD2 of the bias current receiver 420 may be at 0.8V. Thus, the high voltage of the complementary enable signal enb applied to the gate of the PMOS FET M47 is at 0.8V. If the transmission gate 424 is turned off, the reference current $I_{REF}$ is relatively small; and accordingly, the voltage Vin at the current input of the bias current receiver 420 is about 1.2V. As the voltage Vin is applied to the source of the PMOS FET M47, the PMOS FET M47 may be subjected to a source-to-gate voltage (Vsg) of about 0.4V. This Vsg may not be small enough to fully turn off the PMOS FET M47; and thus, leakage current through the transmission gate 424 results.

Figure 5:
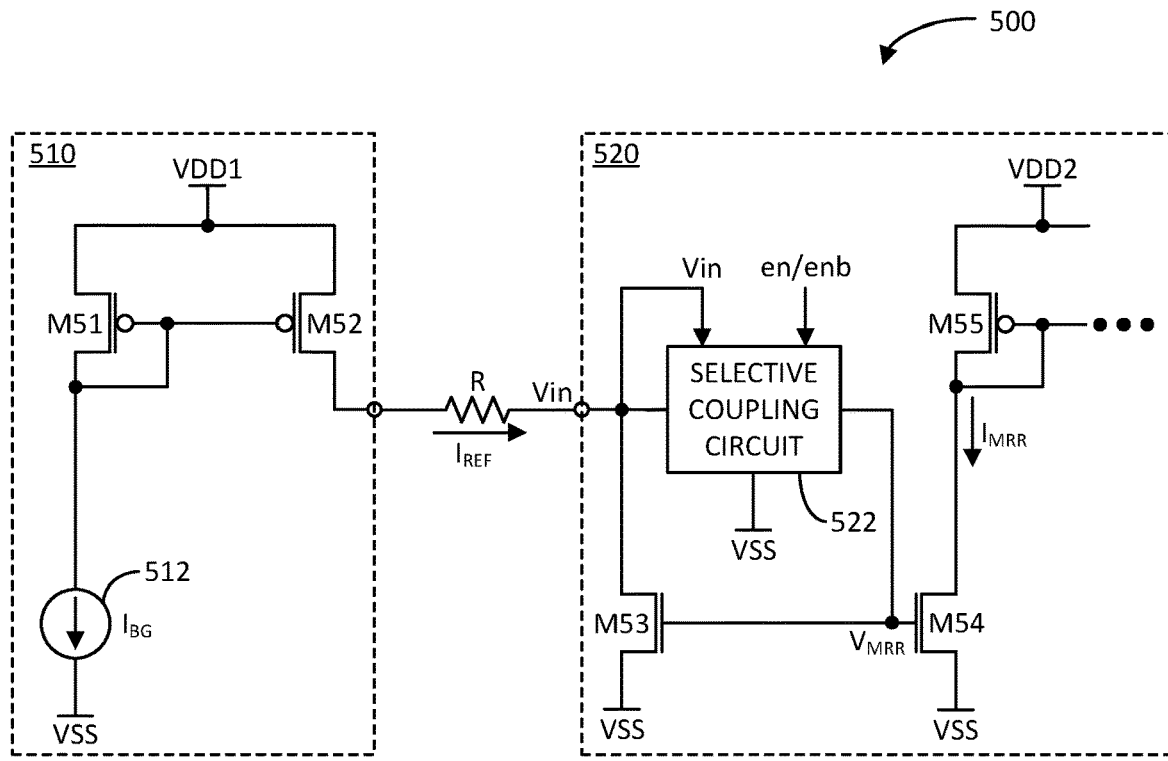
FIG. 5 illustrates a schematic diagram of another example integrated circuit (IC) including another example bias current receiver in accordance with another aspect of the disclosure.

FIG. 5 illustrates a schematic diagram of another example integrated circuit (IC) 500 including an example bias current receiver 520 in accordance with another aspect of the disclosure. In this implementation, the bias current receiver 520 includes a selective coupling circuit 522 including a control input coupled to the current input of the bias current receiver 520 for selectively coupling the current input to gates of current-mirroring NMOS FETs in response to the voltage at the current input and an enable signal. More specifically, when the bias current receiver 520 is disabled, the control input receives the voltage Vin at the current input of the bias current receiver 520, and the selective coupling circuit uses the voltage Vin to decouple the current input of the bias current receiver 520 from the gates of the current mirror NMOS FETs. As discussed further herein with reference to an example implementation, the selective coupling circuit may include a PMOS FET with a source coupled to the current input of the bias current receiver 520 and a gate selectively driven by Vin. Thus, such PMOS FET may be fully turned off because, in this case, the Vsg is substantially zero (0) V; thereby, preventing leakage current through the PMOS FET.

In particular, the IC 500 includes a reference current generator 510 coupled to the bias current receiver 520 via a metal trace R. The reference current generator 510 includes first and second PMOS FETs M51 and M52, and a PVT-stable or bandgap current source 512 in the same configuration as the first and second PMOS FETs M11 and M12, and the PVT-stable or bandgap current source 112 of reference current generator 110. The bias current receiver 520 includes first and second NMOS FETs M53 and M54 and PMOS FET M55 in a similar configuration as the first and second NMOS FETs M13 and M14 and PMOS FET M15 of bias current receiver 120, with the exception that the drain of NMOS FET M53 is not directly coupled to its gate, as discussed further herein. Although not explicitly shown, the bias current receiver 520 may include the set of one or more PMOS FETs MB1 to MBN coupled to the PMOS FET M55 in a current mirror configuration for generating the set of one or more bias currents $I_{B1}$ to $I_{BN}$, respectively.

To address potential gate antenna effect, the bias current receiver 520 further includes a selective coupling circuit 522 including an input coupled to the metal trace R (current input (Vin) of the bias current receiver 520) and an output coupled to the gates of the NMOS FETs M53 and M54. In this configuration, the gates of the NMOS FETs M53 and M54 are not directly coupled to the metal trace R; and thus, the NMOS FETs M53 and M54 are protected against gate antenna effect from the metal trace R. Also, in this example, there is no other gate antenna effect with regard to the metal trace R as it does not terminate at a gate of any device.

In this implementation, the selective coupling circuit 522 includes a first control input coupled to the current input (Vin) of the bias current receiver 520 to receive the input voltage Vin therefrom. The selective coupling circuit 522 further includes a second control input configured to receive at least one of non-complementary enable signal (en) and/or complementary enable signal (enb). As an example, via the second control input the selective coupling circuit 522 may receive: the non-complementary enable signal en, and internally generate the complementary enable signal enb using an inverter; or receive the complementary enable signal enb, and internally generate the non-complementary enable signal en using an inverter; or receive both the non-complementary signal en and the complementary enable signal enb. Also, as depicted, the selective coupling circuit 522 may include a third control input coupled to the lower voltage rail VSS.

As discussed further herein with respect to an example implementation of the selective coupling circuit 522, the selective coupling circuit 522 decouples the current input (Vin) of the bias current receiver 520 from the gates of the NMOS FETs M53 and M54 based on the input voltage Vin and deasserted enable signals en/enb (e.g., en=L, enb=H). The decoupling of the current input (Vin) of the bias current receiver 520 from the gates of the NMOS FETs M53 and M54 is in a manner that substantially eliminates leakage current. Further, the selective coupling circuit 522 couples the current input (Vin) of the bias current receiver 520 to the gates of the NMOS FETs M53 and M54 based on the voltage potential at the lower voltage rail VSS (e.g., 0V) and asserted enable signals en/enb (e.g., en=H, enb=L).

Figure 6:
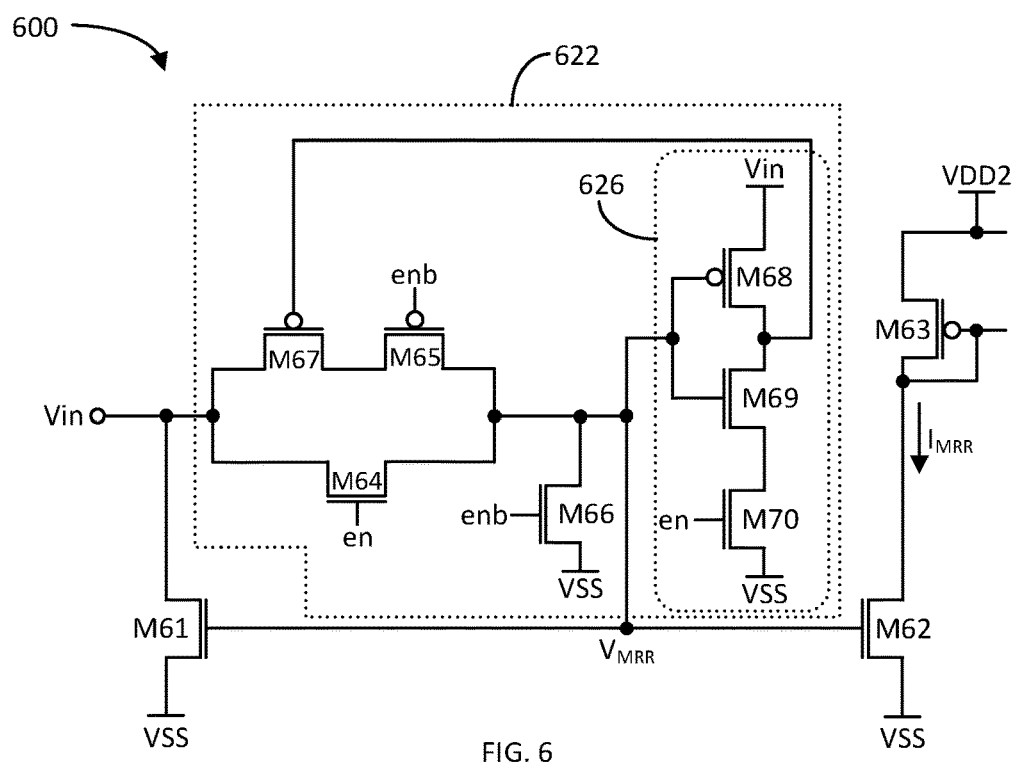
FIG. 6 illustrates a schematic diagram of another example bias current receiver in accordance with another aspect of the disclosure.

FIG. 6 illustrates a schematic diagram of another example bias current receiver 600 in accordance with another aspect of the disclosure. The bias current receiver 600 may be an example implementation of the bias current receiver 520 of IC 500. Similarly, the bias current receiver 600 includes first and second NMOS FETs M61 and M62 and PMOS FET M63 in a similar configuration as the first and second NMOS FETs M13 and M14 and PMOS FET M15 of bias current receiver 120, with the exception that the drain of NMOS FET M61 is not directly coupled to its gate, as discussed further herein. Although not explicitly shown, the bias current receiver 600 may include the set of one or more PMOS FETs MB1 to MBN coupled to the PMOS FET M63 in a current mirror configuration for generating the set of one or more bias currents $I_{B1}$ to $I_{BN}$, respectively.

The bias current receiver 600 includes a selective coupling circuit 622 including an input coupled to or also serving as a current input (Vin) of the bias current receiver 600 and an output coupled to the gates of NMOS FETs M61 and M62. The selective coupling circuit 622 includes a first PMOS FET M67, a second PMOS FET M65, an NMOS FET M64, and an NMOS FET M66. Additionally, the selective coupling circuit 622 includes an inverter 626 including PMOS FET M68, NMOS FET M69, and NMOS FET M70 coupled in series between the current input (Vin) of the bias current receiver 600 and the lower voltage rail VSS.

More specifically, the PMOS FET M67 includes a source coupled to the current input (Vin) of the bias current receiver 600, a drain coupled to the source of the PMOS FET M65, and a gate coupled to an output of the inverter 626. The NMOS FET M64 includes a drain coupled to the current input (Vin), a source coupled to the drain of the PMOS FET M65, and a gate configured to receive a non-complementary enable signal (en). The PMOS FET M65 includes a gate configured to receive a complementary enable signal (enb). The NMOS FET M66 includes a drain coupled to the source/drain of the NMOS FET M64/PMOS FET M65 (as well as the gates of NMOS FETs M61 and M62), a source coupled to the lower voltage rail VSS, and a gate configured to receive the complementary enable signal enb.

The PMOS FET M68 of the inverter 626 includes a source coupled to the current input (Vin) of the bias current receiver 600. The NMOS FET M69 of the inverter 626 includes a drain coupled to the drain of the PMOS FET M68. The gates of the PMOS FET M68 and NMOS FET M69 are coupled together, and to the source/drain of the NMOS FET M64/PMOS FET M65 (as well as the drain of NMOS FET M66 and the gates of NMOS FETs M61 and M62). The gates of the PMOS FET M68 and NMOS FET M69 serve as the input of the inverter 626, and the drains of the PMOS FET M68 and NMOS FET M69 serve as the output of the inverter 626, which, as discussed, is coupled to the gate of the PMOS FET M67. The NMOS FET M70 of the inverter 626 includes a drain coupled to the source of NMOS FET M69, a source coupled to the lower voltage rail VSS, and a gate configured to receive the non-complementary enable signal en.

In operation, when the bias current receiver 600 is enabled by the enable signals being asserted (en=H, enb=L), the NMOS FET M64 and PMOS FET M65 are turned on, the NMOS FET M66 is turned off, and the NMOS FET M70 of the inverter 626 is turned on. As such, there will be some reference current $I_{REF}$ flowing into the selective coupling circuit 622, which may cause the voltage Vin at the current input (Vin) of the bias current receiver 600 to be about 0.8V (e.g., ~VDD1-$I_{REF}$*R). Initially, there will be some voltage drop across the NMOS FET M64 causing the voltage $V_{MRR}$ at the input of the inverter 626 (and gates of the current mirror NMOS FETs M61 and M62) to be about 0.6V (e.g., Vin-$V_T$, where $V_T$ is the threshold voltage of NMOS FET M64). In response to this voltage $V_{MRR}$, the PMOS FET M68 is turned off and the NMOS FET M69 is turned on. Accordingly, the inverter 626 outputs a voltage at substantially VSS potential (e.g., 0V), which is provided to the gate of PMOS FET M67. This fully turns on PMOS FET M67 causing the voltage $V_{MRR}$ at the gates of the current mirror NMOS FETs M61 and M62 to rise to substantially Vin for accurate current mirroring operation.

When the bias current receiver 600 is disabled by the enable signals being deasserted (en=L, enb=H), the NMOS FET M64 and PMOS FET M65 are turned off, the NMOS FET M66 is turned on, and the NMOS FET M70 of the inverter 626 is turned off. As such, the reference current $I_{REF}$ is relatively small due to the turned-off NMOS FET M64/PMOS FET M65; and thus, the voltage Vin at the current input (Vin) of the bias current receiver 600 is about 1.2V (e.g., ~VDD1). The voltage $V_{MRR}$ at the input of the inverter 626 (and gates of the current mirror NMOS FETs M61 and M62) is at substantially VSS potential (e.g., 0V) due to the turned-on NMOS FET M66. In response to this voltage $V_{MRR}$, the PMOS FET M68 is turned on and the NMOS FET M69 is turned off. Accordingly, the inverter 626 outputs a voltage at substantially Vin potential (e.g., 1.2V), which is provided to the gate of PMOS FET M67. This fully turns off the PMOS FET M67 as its Vsg is substantially at 0V; thereby, preventing any leakage current therethrough.

An additional issue arises when the supply voltage VDD2 collapses to VSS potential or 0V. In this regard, the enable signals en and enb also collapse to VSS potential or 0V. Accordingly, with reference again to FIG. 6, the PMOS FET M65 would be turned on, and if the output of the inverter 626 is at VSS potential or 0V, the PMOS FET M67 would also be turned on. Since the supply voltage VDD1 is present in the reference current generator, the reference current $I_{REF}$ flows into the selective coupling circuit 622. As a result, there would be significant current latching into the gates of the current mirror NMOS FETs M61 and M62. As discussed further herein, circuitry is provided in the in the following example implementation of a selective coupling circuit to prevent or reduced latching current into the current mirror NMOS FETs in response to VDD2 collapse.

Figure 7:
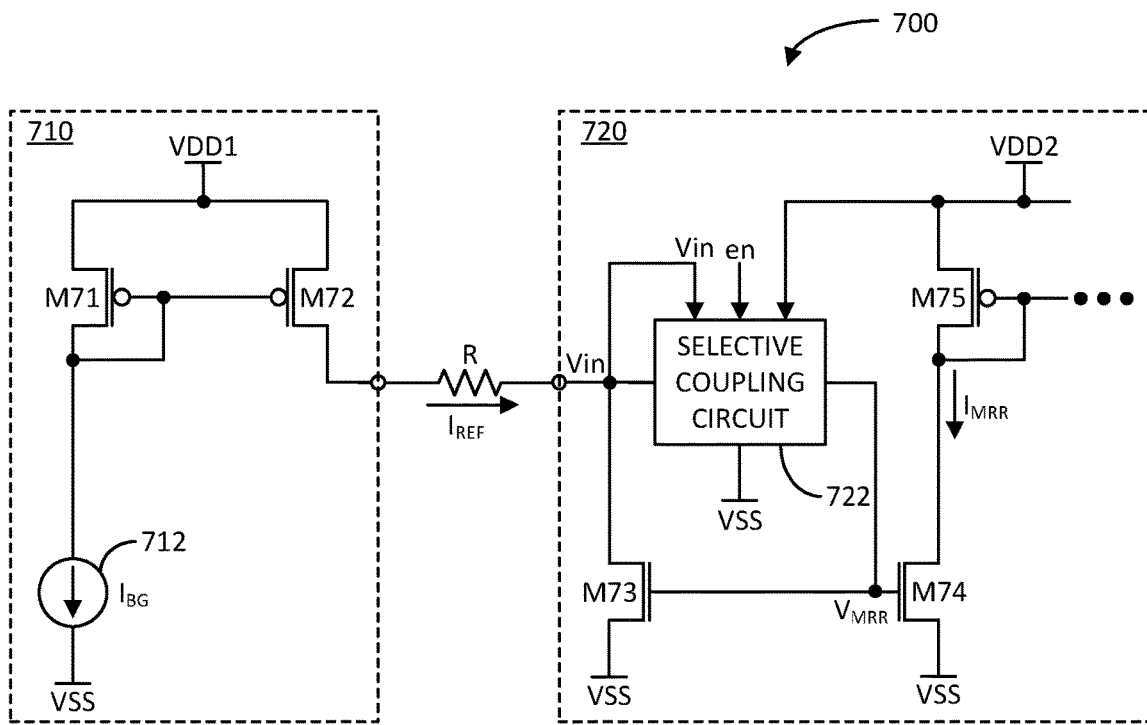
FIG. 7 illustrates a schematic diagram of another example integrated circuit (IC) including another example bias current receiver in accordance with another aspect of the disclosure.

FIG. 7 illustrates a schematic diagram of another example integrated circuit (IC) 700 including an example reference current generator 710 and an example bias current receiver 720 in accordance with another aspect of the disclosure. In this implementation, the bias current receiver 720 includes circuitry that responds to a collapse of the supply voltage VDD2 of the bias current receiver 720 when the supply voltage VDD1 of the reference current generator 710 is present.

More specifically, the IC 700 includes the reference current generator 710 coupled to the bias current receiver 720 via a metal trace R. The reference current generator 710 includes first and second PMOS FETs M71 and M72, and a PVT-stable or bandgap current source 712 in the same configuration as the first and second PMOS FETs M11 and M12, and the PVT-stable or bandgap current source 112 of reference current generator 110. The bias current receiver 720 includes first and second NMOS FETs M73 and M74 and PMOS FET M75 in a similar configuration as the first and second NMOS FETs M13 and M14 and PMOS FET M15 of bias current receiver 120, with the exception that the drain of NMOS FET M73 is not directly coupled to its gate, as discussed further herein. Although not explicitly shown, the bias current receiver 720 may include the set of one or more PMOS FETs MB1 to MBN coupled to the PMOS FET M75 in a current mirror configuration for generating the set of one or more bias currents $I_{B1}$ to $I_{BN}$, respectively.

To address potential gate antenna effect, the bias current receiver 720 further includes a selective coupling circuit 722 including an input coupled to the metal trace R (current input (Vin) of the bias current receiver 720) and an output coupled to the gates of the NMOS FETs M73 and M74. In this configuration, the gates of the NMOS FETs M73 and M74 are not directly coupled to the metal trace R; and thus, the NMOS FETs M73 and M74 are protected against gate antenna effect from the metal trace R. Also, in this example, there is no other gate antenna effect with regard to the metal trace R as it does not terminate at a gate of any device.

In this implementation, the selective coupling circuit 722 includes a first control input coupled to the current input (Vin) of the bias current receiver 720 to receive the input voltage Vin therefrom. The selective coupling circuit 722 further includes a second control input configured to receive at least one of non-complementary enable signal (en) and/or complementary enable signal (enb). Similarly, via the second control input the selective coupling circuit 722 may receive: the non-complementary enable signal en, and internally generate the complementary enable signal enb using an inverter; or receive the complementary enable signal enb, and internally generate the non-complementary enable signal en using an inverter; or receive both the non-complementary signal en and the complementary enable signal enb. The selective coupling circuit 722 also includes a third control input configured to receive the supply voltage VDD2. Also, as depicted, the selective coupling circuit 722 may also be coupled to the lower voltage rail VSS.

As discussed further herein with respect to an example implementation of the selective coupling circuit 722, the selective coupling circuit 722 decouples the current input (Vin) of the bias current receiver 720 from the gates of the NMOS FETs M73 and M74 based on the input voltage Vin, and in response to the supply voltage VDD2 including the enable signals en/enb having collapsed (e.g., all at VSS potential or 0V). The decoupling of the current input (Vin) of the bias current receiver 720 from the gates of the NMOS FETs M73 and M74 is in a manner that substantially eliminates leakage or latching current. Further, the selective coupling circuit 722 couples the current input (Vin) of the bias current receiver 720 to the gates of the NMOS FETs M73 and M74 based on the voltage potential at the lower voltage rail VSS (e.g., 0V) and asserted enable signals en/enb (e.g., en=H, enb=L) when VDD2 has not collapsed.

Figure 8:
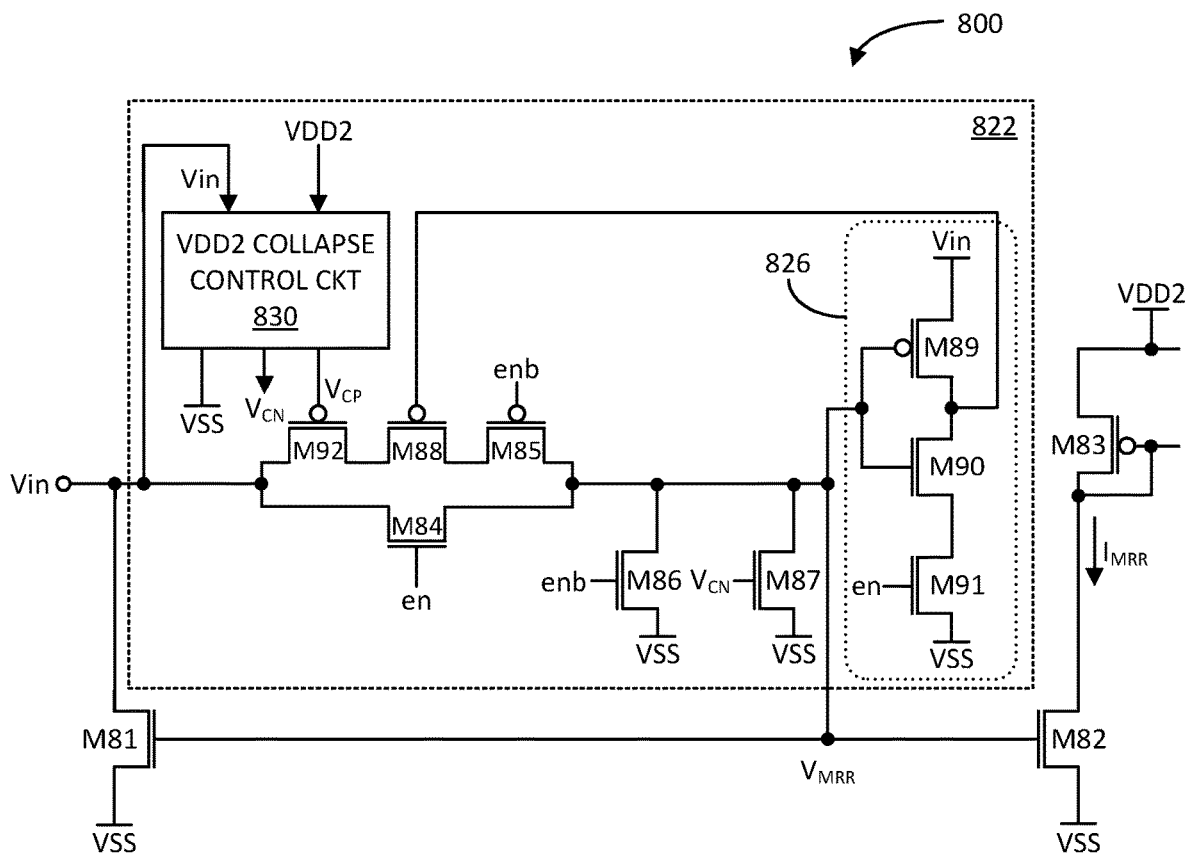
FIG. 8 illustrates a schematic diagram of another example bias current receiver in accordance with another aspect of the disclosure.

FIG. 8 illustrates a schematic diagram of another example bias current receiver 800 in accordance with another aspect of the disclosure. The bias current receiver 800 may be an example implementation of the bias current receiver 720 of IC 700. Similarly, the bias current receiver 800 includes first and second NMOS FETs M81 and M82 and PMOS FET M83 in a similar configuration as the first and second NMOS FETs M13 and M14 and PMOS FET M15 of bias current receiver 120, with the exception that the drain of NMOS FET M81 is not directly coupled to its gate, as discussed further herein. Although not explicitly shown, the bias current receiver 800 may include the set of one or more PMOS FETs MB1 to MBN coupled to the PMOS FET M83 in a current mirror configuration for generating the set of one or more bias currents $I_{B1}$ to $I_{BN}$, respectively.

The bias current receiver 800 includes a selective coupling circuit 822 including an input coupled to or serving as a current input (Vin) of the bias current receiver 800 and an output coupled to the gates of NMOS FETs M81 and M82. The selective coupling circuit 822 includes a first PMOS FET M92, a second PMOS FET M88, a third PMOS FET M85, a first NMOS FET M84, a second NMOS FET M86, and a third NMOS FET M87. Additionally, the selective coupling circuit 822 includes an inverter 826 including PMOS FET M89, NMOS FET M90, and NMOS FET M91 coupled in series between the current input (Vin) of the bias current receiver 800 and the lower voltage rail VSS. Further, the selective coupling circuit 822 includes a supply voltage (VDD2) collapse control circuit 830.

More specifically, the first PMOS FET M92 includes a source coupled to the current input (Vin) of the bias current receiver 800, a drain coupled to the source of the second PMOS FET M88, and a gate coupled to a first control output of the VDD2 collapse control circuit 830 to receive a first control voltage $V_{CP}$ therefrom. The second PMOS FET M88 includes a drain coupled to the source of the third PMOS FET M85, and a gate coupled to an output of the inverter 826. The third PMOS FET M85 includes a gate configured to receive a complementary enable signal (enb). The first NMOS FET M84 includes a drain coupled to the current input (Vin) of the bias current receiver 800, a source coupled to the drain of the third PMOS FET M85, and a gate configured to receive a non-complementary enable signal (en).

The second NMOS FET M86 includes a drain coupled to the source/drain of the NMOS FET M84/PMOS FET M85 (as well as the gates of NMOS FETs M81 and M82), a source coupled to the lower voltage rail VSS, and a gate configured to receive the complementary enable signal enb. The third NMOS FET M87 also includes a drain coupled to the source/drain of the NMOS FET M84/PMOS FET M85 (as well as the gates of NMOS FETs M81 and M82), a source coupled to the lower voltage rail VSS, and a gate coupled to a second control output of the VDD2 collapse control circuit 830 to receive a second control voltage $V_{CN}$ therefrom.

The PMOS FET M89 of the inverter 826 includes a source coupled to the current input (Vin) of the bias current receiver 800. The NMOS FET M90 of the inverter 826 includes a drain coupled to the drain of the PMOS FET M89. The gates of the PMOS FET M89 and NMOS FET M90 are coupled together, and to the source/drain of the NMOS FET M84/PMOS FET M85 (as well as the drains of the second and third NMOS FETs M86 and M87, and the gates of current mirror NMOS FETs M81 and M82). The gates of the PMOS FET M89 and NMOS FET M90 serve as the input of the inverter 826, and the drains of the PMOS FET M89 and NMOS FET M90 serve as the output of the inverter 826, which, as discussed, is coupled to the gate of the second PMOS FET M88. The NMOS FET M91 of the inverter 826 includes a drain coupled to the source of NMOS FET M90, a source coupled to the lower voltage rail VSS, and a gate configured to receive the non-complementary enable signal en.

The VDD2 collapse control circuit 830 includes a first control input coupled to the current input (Vin) of the bias current receiver 800 to receive the voltage Vin therefrom. The VDD2 collapse control circuit 830 includes a second control input coupled to the upper voltage rail VDD2 of the bias current receiver 800 to receive the supply voltage VDD2 therefrom. Also, as depicted, the VDD2 collapse control circuit 830 may include a third control input coupled to the lower voltage rail VSS; it is referred to as a control input as the VSS potential is used to generate control voltages $V_{CP}$ and $V_{CN}$.

In operation, when the supply voltage VDD2 has not collapsed, the selective coupling circuit 822 operates similar to selective coupling circuit 622 previously discussed. That is, when VDD2 has not collapsed, the VDD2 collapse control circuit 830 generates $V_{CP}$ at VSS potential (e.g., 0V) to maintain the first PMOS FET M92 turned on, and generates $V_{CN}$ also at VSS potential (e.g., 0V) to maintain the third NMOS FET M87 turned off. As mentioned, the VDD2 collapse control circuit 830 uses its third control input to generate the control voltages $V_{CP}$ and $V_{CN}$ at VSS potential.

Thus, when the bias current receiver 800 is enabled by the enable signals being asserted (en=H, enb=L), the first NMOS FET M84 and third PMOS FET M85 are turned on, the second NMOS FET M86 is turned off, and the NMOS FET M91 of the inverter 826 is turned on. As such, there will be some reference current $I_{REF}$ flowing into the selective coupling circuit 822, which may cause the voltage Vin at the current input (Vin) of the bias current receiver 800 to be about 0.8V (e.g., ~VDD1−$I_{REF}$*R). Initially, there will be some voltage drop across the first NMOS FET M84 causing the voltage $V_{MRR}$ at the input of the inverter 826 (and gates of the current mirror NMOS FETs M81 and M82) to be about 0.6V (e.g., Vin−$V_T$). In response to this voltage $V_{MRR}$, the PMOS FET M89 is turned off and the NMOS FET M90 is turned on. Accordingly, the inverter 826 outputs a voltage at substantially VSS potential (e.g., 0V), which is provided to the gate of the second PMOS FET M88. This fully turns on PMOS FET M88 causing the voltage $V_{MRR}$ at the gates of the current mirror NMOS FETs M81 and M82 to rise to substantially Vin for accurate current mirroring operation.

When the bias current receiver 800 is disabled by the enable signals being deasserted (en=L, enb=H), the first NMOS FET M84 and the third PMOS FET M85 are turned off, the second NMOS FET M86 is turned on, and the NMOS FET M91 of the inverter 826 is turned off. As such, the reference current $I_{REF}$ is relatively small due to the turned-off NMOS FET M84/PMOS FET M85; and thus, the voltage Vin at the current input (Vin) of the bias current receiver 800 is about 1.2V (e.g., ~VDD1). The voltage $V_{MRR}$ at the input of the inverter 826 (and gates of the current mirror NMOS FETs M81 and M82) is at substantially VSS potential (e.g., 0V) due to the turned-on second NMOS FET M86. In response to this voltage $V_{MRR}$, the PMOS FET M89 is turned on and the NMOS FET M90 is turned off. Accordingly, the inverter 826 outputs a voltage at substantially Vin potential (e.g., 1.2V), which is provided to the gate of the second PMOS FET M88. This fully turns off PMOS FET M88 as its Vsg is substantially at 0V; thereby, preventing any leakage or latching current into the gates of the current mirror NMOS FETs M81 and M82.

When the supply voltage VDD2 has collapsed as sensed by the VDD2 collapse control circuit 830, the VDD2 collapse control circuit 830 generates the first control voltage $V_{CP}$ at substantially Vin to turn off the first PMOS FET M92, and generates the second control voltage $V_{CN}$ at substantially Vin−$V_T$ to turn on the third NMOS FET M87, as discussed in more detail further herein with reference to an example implementation of the VDD2 collapse control circuit 830. The VDD2 collapse control circuit 830 uses its coupling to the current input (Vin) of the bias current receiver 800 to generate the control signals $V_{CP}$ and $V_{CN}$ at substantially Vin and Vin–$V_T$, respectively. The turned-off first PMOS FET M92 and turned-on third NMOS FET M87 prevents leakage or latching current into the gates of the current mirroring NMOS FETs M81 and M82.

Figure 9:
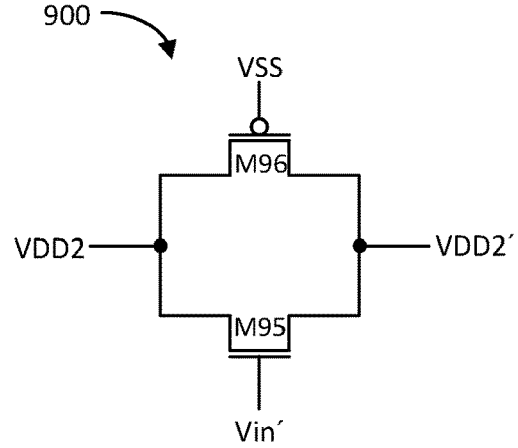
FIG. 9 illustrates a schematic diagram of an example transmission gate of an example voltage rail collapse control circuit of the bias current receiver of FIG. 8 in accordance with another aspect of the disclosure.

FIG. 9 illustrates a schematic diagram of an example transmission gate 900 in accordance with another aspect of the disclosure. The transmission gate 900 may be an example implementation of the second control input circuitry of the VDD2 collapse control circuit 830. As discussed further herein, the transmission gate 900 is coupled between the second upper voltage rail VDD2 and an input (gates) of an inverter discussed further herein. As there may be a relatively long metal trace between the VDD2 voltage rail and the gates of the inverter, the transmission gate 900 isolates the gates from the metal trace to eliminate or reduce the likelihood of gate antenna effect damage to the FETs of the inverter.

More specifically, the transmission gate 900 includes parallel-coupled NMOS FET M95 and PMOS FET M96 including drain and source coupled together, respectively, which serve as the second control input of the VDD2 collapse control circuit 830. The NMOS FET M95 and PMOS FET M96 include source and drain coupled together, respectively, which is configured to generate a voltage VDD2' related to (e.g., substantially the same as) the supply voltage VDD2. The NMOS FET M95 includes a gate configured to receive a voltage Vin', which may be substantially equal to the voltage Vin at the current input of the bias current receiver 800 minus a threshold voltage $V_T$ of an NMOS FET, as discussed further herein. The PMOS FET M96 includes a gate coupled to the lower voltage rail VSS.

In operation, when the supply voltage VDD2 has not collapsed (e.g., VDD2=0.8V), the PMOS FET M96 of the transmission gate 900 operates to substantially pass the supply voltage VDD2 to generate the voltage VDD2'. When the supply voltage VDD2 has collapsed (e.g., VDD2=0V), the NMOS FET M95 of the transmission gate 900 operates to substantially pass the supply voltage VDD2 to generate the voltage VDD2'.

Figure 10:
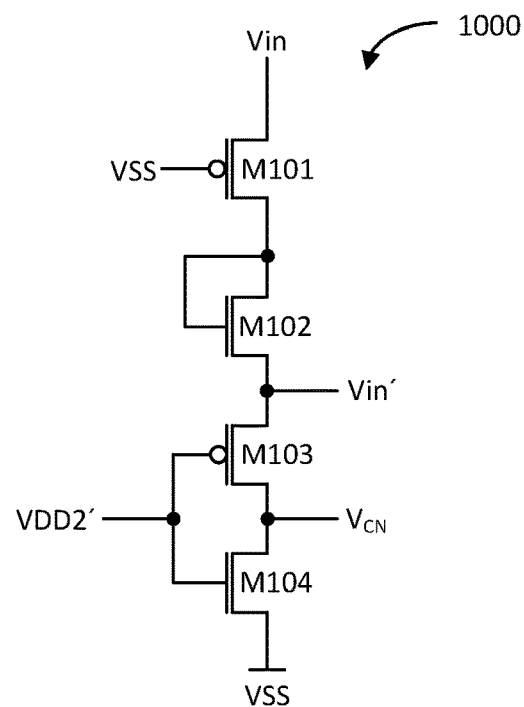
FIG. 10 illustrates a schematic diagram of an example inverter of the example voltage rail collapse control circuit of the bias current receiver of FIG. 8 in accordance with another aspect of the disclosure.

FIG. 10 illustrates a schematic diagram of an example inverter 1000 in accordance with another aspect of the disclosure. The inverter 1000 is an example of a circuit for generating the second control voltage $V_{CN}$ for the gate of the third NMOS FET M87 of the selective coupling circuit 822 in response to voltage VDD2' generated by the transmission gate 900.

In particular, the inverter 1000 includes a PMOS FET M101, a diode-connected NMOS FET M102, a PMOS FET M103, and an NMOS FET 104 coupled in series between the current input (Vin) of the bias current receiver 800 and the lower voltage rail VSS. More specifically, the PMOS FET M101 includes a source coupled to the current input (Vin) of the bias current receiver 800, a gate coupled to the lower voltage rail VSS, and a drain coupled to the drain and gate of the diode-connected NMOS FET M102. The diode-connected NMOS FET M102 includes a source coupled to a source of PMOS FET M103. The NMOS FET M104 includes a gate coupled to the gate of the PMOS FET M103, a drain coupled to the drain of the PMOS FET M103, and a source coupled to the lower voltage rail VSS.

The gates of the PMOS FET M103 and NMOS FET M104 are coupled to the output of the transmission gate 900 to receive the voltage VDD2' therefrom. The sources of the diode-connected NMOS FET M102 and the PMOS FET M103 are coupled to the gate of the NMOS FET M95 of the transmission gate 900 to provide the voltage Vin' thereto.

The second control voltage $V_{CN}$ for the gate of the third NMOS FET M87 of the selective coupling circuit 822 is generated at the drains of PMOS FETs M103 and NMOS FET M104.

In operation, the diode-connected NMOS FET M102 reduces the voltage Vin by the threshold voltage $V_T$ of the NMOS FET M102 to generate the voltage Vin'. This is done to prevent leakage current through the PMOS FET M103 when the inverter 1000 generates a logic low control voltage $V_{CN}$. For example, the inverter 1000 generates a logic low control voltage $V_{CN}$ when the voltage VDD2' is logically high (e.g., when the supply voltage VDD2 has not collapsed). The voltage VDD2' may be about 0.8V when not collapsed. If Vin (e.g., at 1.2V) were to be applied directly to the source of PMOS FET M103, then the PMOS FET M103 would have a Vsg of about 0.4V, which may not be sufficient to turn off the PMOS FET M103; and leakage current through the PMOS FET M103 would result. Thus, the diode-connected NMOS FET M102 lowers the voltage Vin' at the source of PMOS FET M103 to lower the Vsg of PMOS FET M103 to reduce or prevent leakage current therethrough.

Thus, when the supply voltage VDD2 has not collapsed, the voltage VDD2' is logically high (e.g., at 0.8V), which causes the inverter 1000 to generate the control voltage $V_{CN}$ at a logic low at VSS potential. The control voltage $V_{CN}$ at VSS potential turns off the third NMOS FET M87 of the selective coupling circuit 822; thereby, allowing the gates of the current mirroring NMOS FETs M81 and M82 to develop a gate voltage $V_{MRR}$ in response to the reference current $I_{REF}$ for current mirroring purposes. When the supply voltage VDD2 has collapsed, the voltage VDD2' is logically low (e.g., at 0V), which causes the inverter 1000 to generate the control voltage $V_{CN}$ at a logic high of Vin–$V_T$. The control voltage $V_{CN}$ at Vin–$V_T$ turns on the third NMOS FET M87 of the selective coupling circuit 822; thereby, grounding the gates of the current mirroring NMOS FETs M81 and M82 to disable the current mirroring operation.

Figure 11:
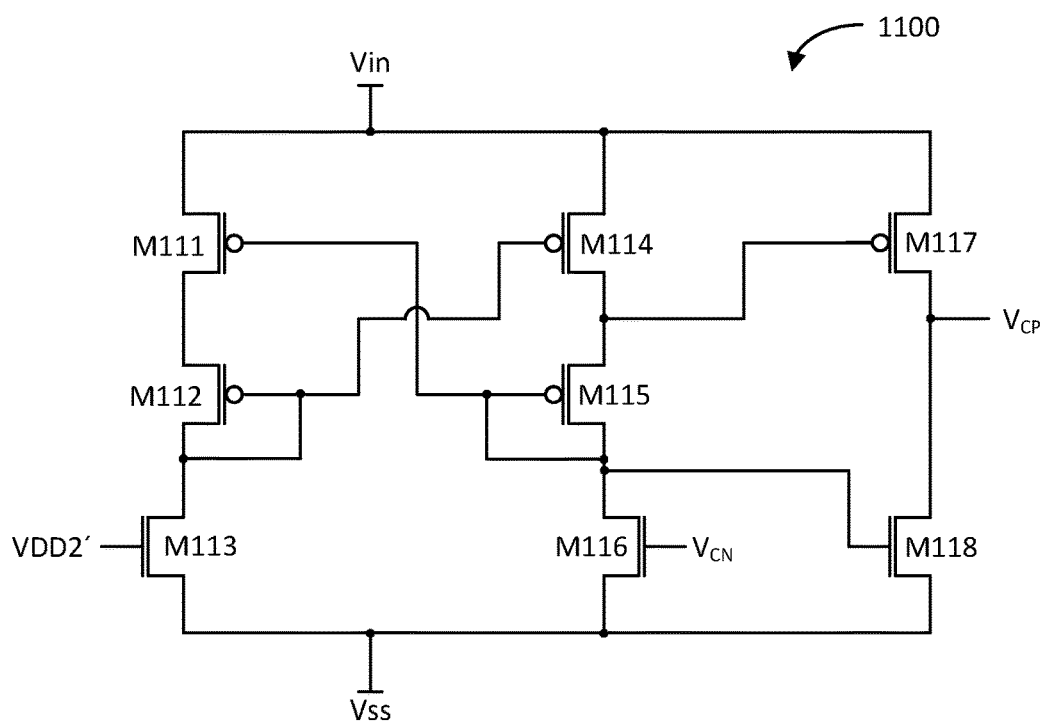
FIG. 11 illustrates a schematic diagram of an example voltage level shifter of the example voltage rail collapse control circuit of the bias current receiver of FIG. 8 in accordance with another aspect of the disclosure.

FIG. 11 illustrates a schematic diagram of an example voltage level shifter 1100 in accordance with another aspect of the disclosure. The voltage level shifter 1100 is an example of a circuit for generating the first control voltage $V_{CP}$ for the gate of the first PMOS FET M92 of the selective coupling circuit 822 in response to voltages VDD2' generated by the transmission gate 900 and the second control voltage $V_{CN}$ generated by the inverter 1000. The circuit 1100 is termed a voltage level shifter because the input voltages VDD2' and $V_{CN}$ vary substantially in accordance with the VDD2 voltage domain (e.g., between 0 and 0.8V), and the first control voltage $V_{CP}$ vary substantially in accordance with the VDD1 voltage domain (e.g., between 0 and 1.2V).

In particular, the voltage level shifter 1100 includes a first PMOS FET M111, a second PMOS FET M112, and a first NMOS FET M113 coupled in series between the current input (Vin) of the bias current receiver 800 and the lower voltage rail VSS. That is, the first PMOS FET M111 includes a source coupled to the current input (Vin) of the bias current receiver 800, and a drain coupled to the source of the second PMOS FET M112. The second PMOS FET M112 includes a gate and a drain coupled together, and to a drain of the first NMOS FET M113. The first NMOS FET M113 includes a source coupled to the lower voltage rail VSS, and a gate coupled to the output of the transmission gate 900 to receive the voltage VDD2'.

The voltage level shifter 1100 includes a third PMOS FET M114, a fourth PMOS FET M115, and a second NMOS FET M116 coupled in series between the current input (Vin) of the bias current receiver 800 and the lower voltage rail VSS. That is, the third PMOS FET M114 includes a source coupled to the current input (Vin) of the bias current receiver 800, a gate coupled to the gate and drain of the second PMOS FET M112, and a drain coupled to the source of the fourth PMOS FET M115. The fourth PMOS FET M115 includes a gate and a drain coupled together, and to a gate of the first PMOS FET M111 and a drain of the second NMOS FET M116. The second NMOS FET M116 includes a source coupled to the lower voltage rail VSS, and a gate coupled to the output of the inverter 1000 to receive the second control voltage $V_{CN}$.

Additionally, the voltage level shifter 1100 includes a fifth PMOS FET M117 and a third NMOS FET M118 coupled in series between the current input (Vin) of the bias current receiver 800 and the lower voltage rail VSS. That is, the fifth PMOS FET M117 includes a source coupled to the current input (Vin) of the bias current receiver 800, a gate coupled to the drain of the third PMOS FET M114 and the source of the fourth PMOS FET M115, and a drain coupled to the drain of the third NMOS FET M118. The NMOS FET M118 includes a gate coupled to the gate/drain of the fourth PMOS FET M115 (as well as the gate of the first PMOS FET M111 and the drain of the second NMOS FET M116). The NMOS FET M118 includes a source coupled to the lower voltage rail VSS. The first control voltage $V_{CP}$ is generated at the drains of PMOS FETs M117 and NMOS FET M118.

In operation, when the supply voltage VDD2 has not collapsed, the voltage VDD2' is logically high, and the second control voltage $V_{CN}$ is logically low. The logic high voltage VDD2' turns on the first NMOS FET M113. As a result, the gate of the third PMOS FET M114 is driven to VSS potential (e.g., 0V) causing the third PMOS FET M114 to turn on. The turned-on third PMOS FET M114 causes Vin to be applied to the gate of the fifth PMOS FET M117 causing the fifth PMOS FET M117 to turn off. The turned-on third PMOS FET M114 also applies Vin to the source of the diode-connected fourth PMOS FET M115. Accordingly, the voltage at the gate/drain of the diode-connected fourth PMOS FET M115 is Vin–$V_T$, which being applied to the gate of the third NMOS FET M118 causes NMOS FET M118 to turn on. This causes the first control voltage $V_{CP}$ to decrease to VSS potential to turn on the PMOS FET M92 of the selective coupling circuit 822.

When the supply voltage VDD2 has collapsed, the voltage VDD2' is logically low, and the second control voltage $V_{CN}$ is logically high. The logic high voltage $V_{CN}$ turns on the second NMOS FET M116. As a result, the gate of the first PMOS FET M111 is driven to VSS potential (e.g., 0V) causing the first PMOS FET M111 to turn on. The turned-on first PMOS FET M111 applies Vin to the source of diode-connected second PMOS FET M112. Accordingly, the voltage at the gate/drain of the diode-connected second PMOS FET M112 is greater than Vin–$V_T$, which being applied to the gate of third PMOS FET M114 causes PMOS FET M114 to turn off. The gate of the third NMOS FET M118 is driven to VSS potential, thereby turning off NMOS FET M118. Also, the gate of the fourth PMOS FET M115 is driven to VSS potential (e.g., 0V) causing the fourth PMOS FET M115 to turn on. The turned-on fourth PMOS FET M115 causes $V_T$ potential to be applied to the gate of the fifth PMOS FET M117 to turn on PMOS FET M117. The turned-on PMOS FET M117 causes the first control voltage $V_{CP}$ to be at Vin to turn off the PMOS FET M92 of the selective coupling circuit 822.

Figure 12:
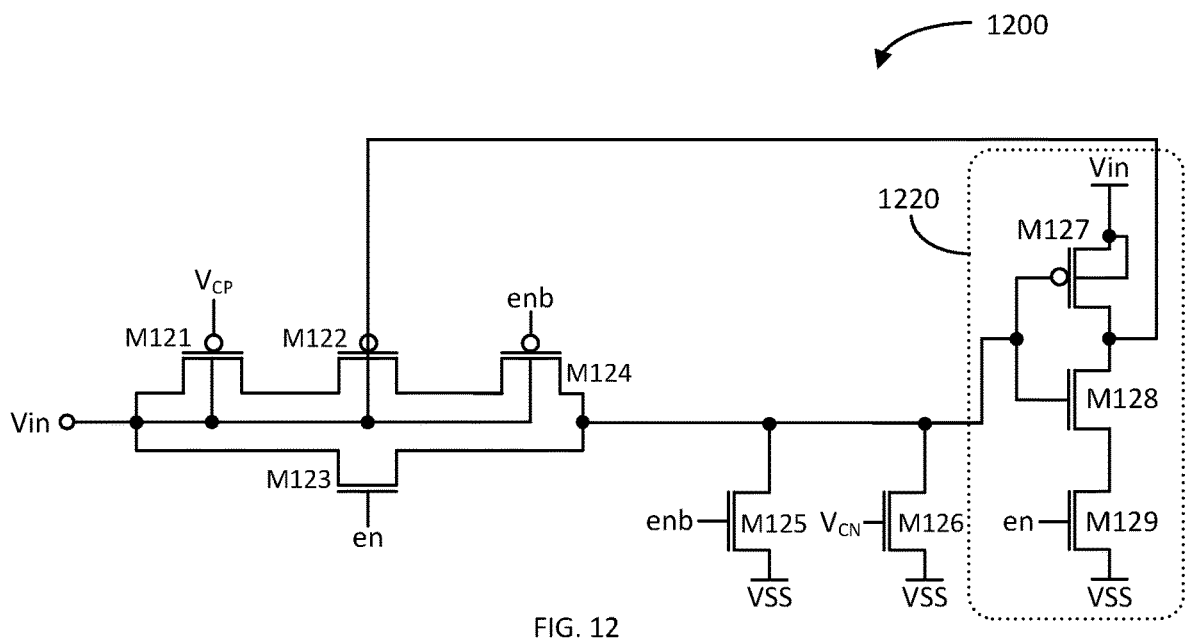
FIG. 12 illustrates a schematic diagram of another example selective coupling circuit in accordance with another aspect of the disclosure.

FIG. 12 illustrates a schematic diagram of another example selective coupling circuit 1200 in accordance with another aspect of the disclosure. The selective coupling circuit 1200 may be an example more detailed implementation of the selective coupling circuit 822 of bias current receiver 800 previously discussed. Although not shown, the selective coupling circuit 1200 may include the VDD2 collapse control circuit 830.

The selective coupling circuit 1200 includes first, second, and third PMOS FETs M121, M122, and M124, a first, second, and third NMOS FETs M123, M125 and M126, and an inverter 1220 including PMOS FET M127 and NMOS FETs M128 and M129. These devices correspond to the first, second, and third PMOS FETs M92, M88, and M85, the first, second, and third NMOS FETs M84, M86 and M87, and the inverter 826 including the PMOS FET M89 and NMOS FETs M90 and M91 of the selective coupling circuit 822 previously discussed in detail, respectively.

In selective coupling circuit 1200, the bulk (n-well) of each of the PMOS FETs M121, M122, M124, and M127 is coupled to the current input (Vin) of the associated bias current receiver to prevent leakage current through the corresponding source/n-well junction if the bulk (n-well) were to be biased with the supply voltage VDD2 of the bias current receiver. For example, the voltage Vin (e.g., 1.2V) may be applied to the sources of the PMOS FETs M121, M122, M124, and M127, and if the supply voltage VDD2 (e.g., 0.8V) were to be applied to the bulks (n-wells) of these FETs, then the p-doped source and the n-well form a pn-junction that would be forward biased based on such voltages. As a result, leakage current occurs via the source/n-well junction of the PMOS FETs M121, M122, M124, and M127. Thus, in selective coupling circuit 1200, the bulk (n-well) of each of the PMOS FETs M121, M122, M124, and M127 is coupled to the current input (Vin) to prevent such leakage current.

Figure 13A:
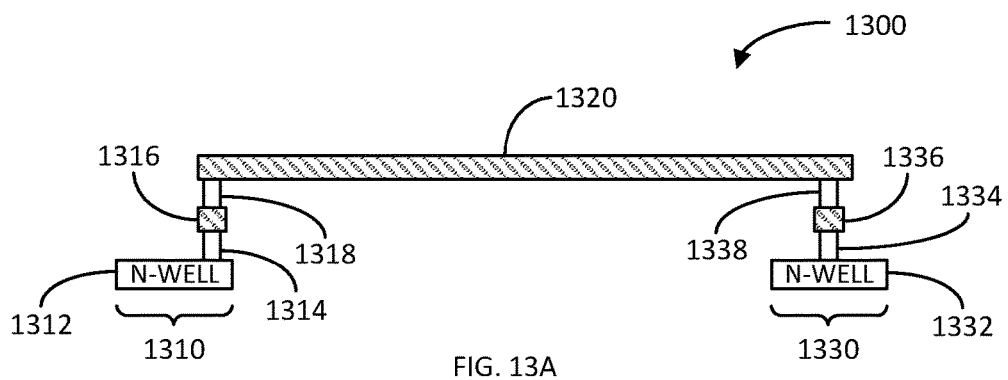
FIGS. 13A-13B illustrate side views of example integrated circuits (ICs) that eliminate gate antenna effects associated with a coupling of a metal trace to a bulk of a field effect transistor (FET) in accordance with another aspect of the disclosure.

FIG. 13A illustrates a side view of example integrated circuit (IC) 1300 that eliminates gate antenna effect associated with a coupling of a metal trace to a bulk of a field effect transistor (FET) in accordance with another aspect of the disclosure. As previously mentioned with regard to IC 100, the metal trace R may have a length (e.g., 10-15 mm) that may cause gate antenna effect if it were to terminate at a gate of a FET. Also, as previously discussed, the metal trace R of ICs 100, 200, 300, 400, 500, and 700 terminates at the current input (Vin) of the corresponding bias current receivers 120, 220, 320, 420, 520, and 720, respectively.

Thus, with regard to the selective coupling circuit 1200, such a metal trace R may terminate at the bulk (n-well) of each of the PMOS FETs M121, M122, M124, and M127. As the bulk (n-well) couples directly to the gate oxide or insulator of the corresponding PMOS FET, the gate oxide or insulator may experience gate antenna effect damage due to the direct coupling of the metal trace R to the bulk (n-well) of the corresponding PMOS FET. The IC 1300 includes a layout approach to eliminate gate antenna effect due to the coupling of a metal trace R to the bulk (n-well) of a PMOS FET.

In particular, the IC 1300 includes a first n-well 1310, which may be associated with a reference current generator. The IC 1300 includes a second n-well 1330, which may be associated with a bias current receiver, such as the one that includes the selective coupling circuit 1200. For example, the second n-well 1330 may be the bulk (n-well) of any of the PMOS FETs M121, M122, M124, and M127 of the selective coupling circuit 1200. The IC 1300 further includes a metal trace 1320 electrically coupling the first n-well 1310 to the second n-well 1330.

More specifically, one end (left, as shown) of the metal trace 1320 may be coupled to the first n-well 1310 by way of an upper metallized via hole 1318, a lower metal layer 1316, and a lower metallized via hole 1314. Similarly, the other end (right, as shown) of the metal trace 1320 may be coupled to the second n-well 1330 by way of an upper metallized via hole 1338, a lower metal layer 1336, and a lower metallized via hole 1334. In this configuration, the metal trace 1320 is coupled to the pins of the cells including the n-wells 1310 and 1330. Accordingly, if the metal trace 1320 is at a metal layer or higher including ends that couple to both n-wells 1310 and 1330 when formed, then gate antenna effect may not be an issue as the charges accumulated on the metal trace 1320 discharge via multiple paths and relatively large area to prevent a large concentration of charges to discharge via a gate oxide or insulator, which may damage the corresponding FET.

Figure 13B:
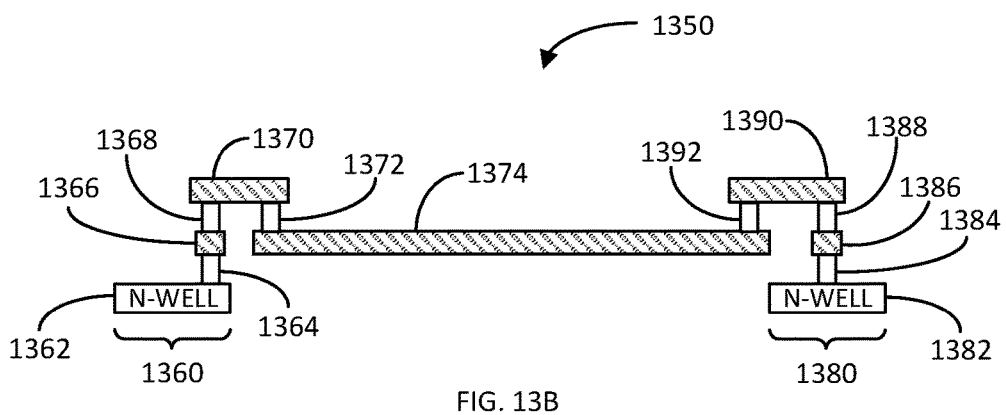

FIG. 13B illustrates a side view of another example integrated circuit (IC) 1350 that eliminates gate antenna effect associated with a coupling of a metal trace to a bulk of a field effect transistor (FET) in accordance with another aspect of the disclosure.

The IC 1350 includes a first n-well 1360, which may be associated with a reference current generator. The IC 1350 includes a second n-well 1380, which may be associated with a bias current receiver, such as the one that includes the selective coupling circuit 1200. Similarly, the second n-well 1380 may be the bulk (n-well) of any of the PMOS FETs M121, M122, M124, and M127 of the selective coupling circuit 1200. The IC 1350 further includes a metal trace 1374 electrically coupling the first n-well 1360 to the second n-well 1380. Unlike the metal trace 1320, the metal trace 1374 is below the metal layer that directly couples to the pins of the cells incorporating n-wells 1360 and 1380, respectively. In such case, the sequence of the manufacturing of the IC 1350 should be considered to prevent gate antenna effect on the device associated with n-well 1380.

For example, the metal trace 1374 may be formed on the same metal layer as metal contacts 1366 and 1386, which are coupled to the n-wells 1360 and 1380 by way of metallized via holes 1364 and 1384, respectively. Then, jumpers 1370 and 1390 may be formed, which are coupled to the metal trace 1374 via metallized via holes 1372 and 1392, respectively. The jumpers 1370 and 1390 may also be coupled to the metal contacts 1366 and 1386 by way of metallized via holes 1368 and 1388, respectively. Thus, during manufacturing, the metal trace 1374 is electrically coupled to the n-wells 1360 and 1380 at the same time via the jumpers 1370 and 1390, allowing the charges accumulated on the metal trace 1374 to discharge via multiple paths and relatively large area to prevent a large concentration of charges to discharge via a gate oxide or insulator, which may damage the corresponding FET.

Figure 14:
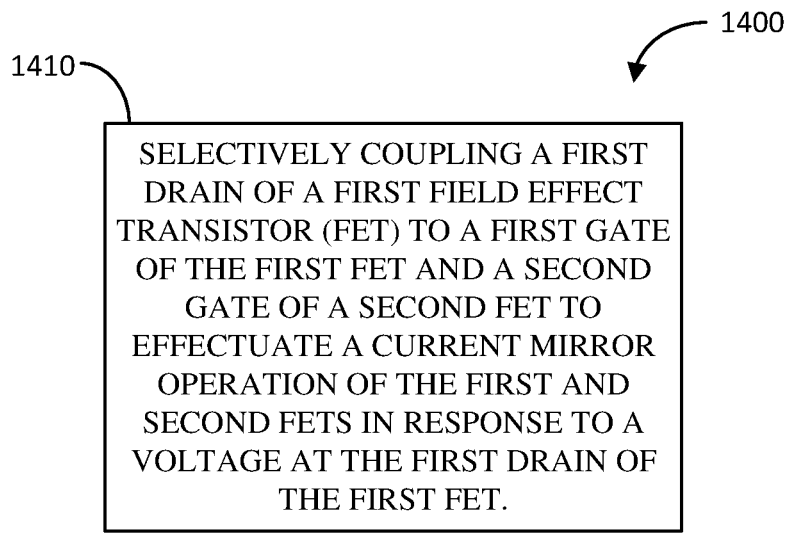
FIG. 14 illustrates a flow diagram of an example method of generating bias currents in accordance with another aspect of the disclosure.

FIG. 14 illustrates a flow diagram of an example method 1400 of generating bias currents in accordance with another aspect of the disclosure. The method 1400 includes selectively coupling a first drain of a first field effect transistor (FET) to a first gate of the first FET and a second gate of a second FET to effectuate a current mirror operation of the first and second FETs in response to a voltage at the first drain of the first FET (block 1410). Examples of means for selectively coupling a first drain of a first field effect transistor (FET) to a first gate of the first FET and a second gate of a second FET to effectuate a current mirror operation of the first and second FETs in response to a voltage at the first drain of the first FET include the selective coupling circuits 522, 622, 722, 822, including sub-circuits 900, 1000, and 1100 described herein.

With regard to selectively coupling the first drain of the first FET to the first and second gates of the first and second FETs, respectively, the method 1400 may further include selectively coupling the first drain of the first FET to the first and second gates of the first and second FETs, respectively, in response to an enable signal. Examples of means for selectively coupling the first drain of the first FET to the first and second gates of the first and second FETs, respectively, in response to an enable signal include any of selective coupling circuits described herein.

Additionally, the method 1400 may include generating a current through the second FET based on a supply voltage, wherein selectively coupling the first drain of the first FET to the first and second gates of the first and second FETs, respectively, further includes decoupling the first drain of the first FET from the first and second gates of the first and second FETs in response to the supply voltage collapsing. Examples of means for generating a current through the second FET based on a supply voltage includes the PMOS FETs M15, M25, M35, M45, M55, M63, M75, and M83 coupled in series with NMOS FETs M14, M24, M34, M44, M54, M62, M74, and M82 between the upper voltage rail VDD2 and the lower voltage rail VSS, respectively. Examples of means for decoupling the first drain of the first FET from the first and second gates of the first and second FETs in response to the supply voltage collapsing includes selective coupling circuits 722 and 822 including sub-circuits 900, 1000, and 1100 described herein.

Figure 15:
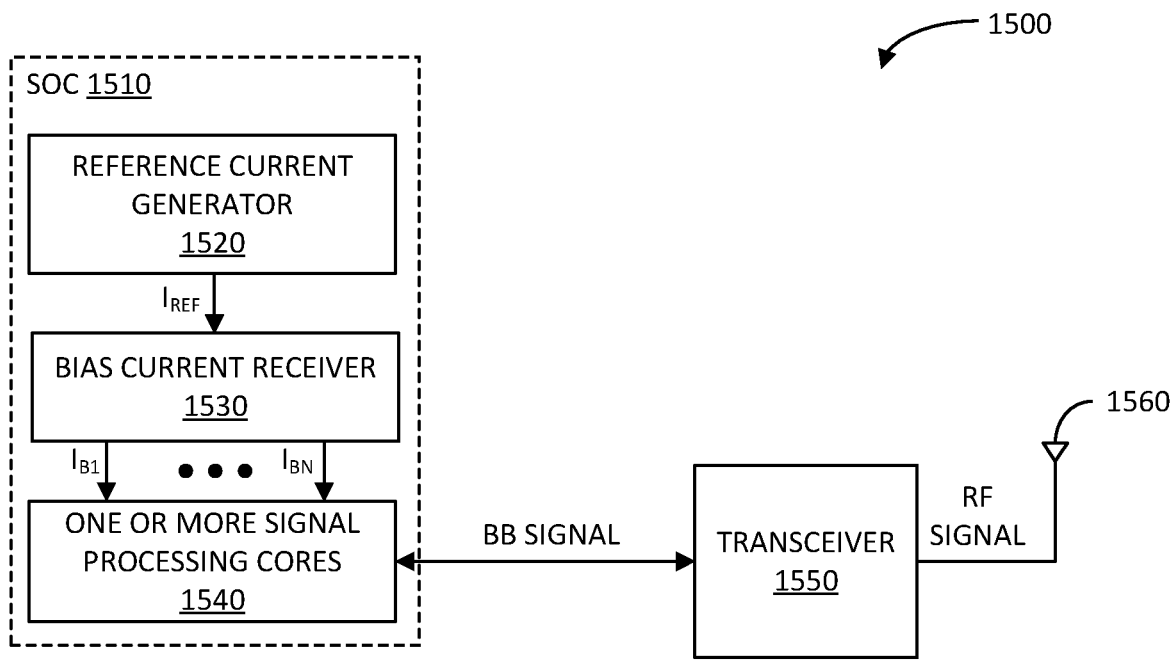
FIG. 15 illustrates a block diagram of an example wireless communication device in accordance with another aspect of the disclosure.

FIG. 15 illustrates a block diagram of an example wireless communication device 1500 in accordance with another aspect of the disclosure. The wireless communication device 1500 may be a smart phone, a desktop computer, laptop computer, tablet device, Internet of Things (IoT), wearable wireless device (e.g., wireless watch), and other types of wireless device.

In particular, the wireless communication device 1500 includes an integrated circuit (IC), which may be implemented as a system on chip (SOC) 1510. The SOC 1510 includes a reference current generator 1520, a bias current receiver 1530, and one or more signal processing cores 1540. For example, the reference current generator 1520 is coupled to the bias current receiver 1530 to provide the reference current $I_{REF}$ thereto. The bias current receiver 1530 is coupled to the one or more signal processing cores 1540 to provide thereto a set of one or more bias currents $I_{B1}$ and $I_{BN}$ based on the reference current $I_{REF}$. The one or more signal processing cores 1540 may use the set of one or more bias currents $I_{B1}$ and $I_{BN}$ to generate a transmit baseband (BB) signal and process a received baseband (BB) signal.

The wireless communication device 1500 may further include a transceiver 1550 and at least one antenna 1560 (e.g., an antenna array). The transceiver 1550 is coupled to the one or more signal processing cores 1540 to receive therefrom the transmit BB signal and provide thereto the received BB signal. The transceiver 1550 is configured to convert the transmit BB signal into a transmit radio frequency (RF) signal, and convert a received RF signal into the received BB signal. The transceiver 1550 is coupled to the at least one antenna 1560 to provide thereto the transmit RF signal for electromagnetic radiation into a wireless medium for wireless transmission, and receive the received RF signal electromagnetically picked up from the wireless medium by the least one antenna 1560.

The following provides an overview of aspects of the present disclosure:

Aspect 1: An integrated circuit (IC), including: a current mirror, including: a first field effect transistor (FET) including a first drain, a first gate, and a first source, wherein the first source is coupled to a first voltage rail; and a second FET including a second drain, a second gate, and a second source, wherein the second gate is coupled to the first gate of the first FET, and the second source is coupled to the first voltage rail; and a selective coupling circuit configured to selectively couple the first drain of the first FET to the first and second gates of the first and second FETs based on a voltage at the first drain of the first FET.

Aspect 2: The IC of aspect 1, wherein the selective coupling circuit includes: a third FET including a third source, a third gate, and a third drain, wherein the third source coupled to the first drain of the first FET; and an inverter coupled between the first drain of the first FET and the first voltage rail, wherein the inverter includes an input coupled to the third drain of the third FET, and an output coupled to the third gate of the third FET.

Aspect 3: The IC of aspect 2, wherein the inverter includes: a fourth FET including a fourth source, a fourth gate, and a fourth drain, wherein the fourth source is coupled to the first drain of the first FET; and a fifth FET including a fifth drain, a fifth gate, and a fifth source, wherein the fifth drain is coupled to the fourth drain of the fourth FET, wherein the fifth gate is coupled to the fourth gate of the fourth FET, and wherein the fifth source is coupled to the first voltage rail.

Aspect 4: The IC of aspect 3, wherein the first, second, and fifth FETs each includes an n-channel metal oxide semiconductor field effect transistor (NMOS FET), and wherein the third and fourth FETs each includes a p-channel metal oxide semiconductor field effect transistor (PMOS FET).

Aspect 5: The IC of aspect 4, wherein the third and fourth FETs each includes an n-well coupled to the first drain of the first FET.

Aspect 6: The IC of aspect 5, wherein the n-well is coupled to a metal trace via a jumper.

Aspect 7: The IC of any one of aspects 1-6, wherein the selective coupling circuit is further configured to couple the first drain of the first FET to the first and second gates of the first and second FETs based on a first enable signal.

Aspect 8: The IC of aspect 7, wherein the selective coupling circuit includes: a first NMOS FET including a third drain, a third gate, and a third source, wherein the third drain is coupled to the first drain of the first FET, wherein the third gate is configured to receive the first enable signal, and wherein the third source is coupled to the first and second gates of the first and second FETs; and a first PMOS FET including a fourth source, a fourth gate, and a fourth drain, wherein the fourth source is coupled to the third drain of the first NMOS FET, wherein the fourth gate is configured to receive a second enable signal being complementary to the first enable signal, and wherein the fourth drain is coupled to the third source of the first NMOS FET.

Aspect 9: The IC of aspect 8, wherein the selective coupling circuit further includes a second NMOS FET including a fifth drain, a fifth gate, and a fifth source, wherein the fifth drain is coupled to the first and second gates of the first and second FETs, wherein the fifth gate is configured to receive the second enable signal, and wherein the fifth source is coupled to the first voltage rail.

Aspect 10: The IC of aspect 9, wherein the selective coupling circuit further includes: a second PMOS FET including a sixth source, a sixth gate, and a sixth drain, wherein the sixth source is coupled to the first drain of the first FET, and wherein the sixth drain is coupled to the fourth source of the first PMOS FET; and an inverter coupled between the first drain of the first FET and the first voltage rail, wherein the inverter includes an input coupled to the first and second gates of the first and second FETs, and an output coupled to the sixth gate of the second PMOS FET.

Aspect 11: The IC of aspect 10, wherein the first and second PMOS FETs each includes an n-well coupled to the first drain of the first FET.

Aspect 12: The IC of any one of aspects 1-11, further including a third FET coupled in series with the second FET between a second voltage rail and the first voltage rail.

Aspect 13: The IC of aspect 12, wherein the selective coupling circuit is further configured to selectively couple the first drain of the first FET to the first and second gates of the first and second FETs based on a supply voltage at the second voltage rail.

Aspect 14: The IC of aspect 13, wherein the selective coupling circuit includes: a control circuit including a first control input coupled to the first drain of the first FET, a second control input coupled to the second voltage rail, and a third control input coupled to the first voltage rail; a first control output, and a second control output; a PMOS FET including a fourth source, a fourth gate, and a fourth drain, wherein the fourth source is coupled to the first drain of the first FET, wherein the fourth gate is coupled to the first control output of the control circuit, and wherein the fourth drain is coupled to the first and second gates of the first and second FETs; and an NMOS FET including a fifth drain, a fifth gate, and a fifth source, wherein the fifth drain is coupled to the first and second gates of the first and second FETs, wherein the fifth gate is coupled to the second control output of the control circuit, and wherein the fifth source is coupled to the first voltage rail.

Aspect 15: The IC of aspect 14, wherein the control circuit set a first control signal at the first control output to turn on the PMOS FET and a second control signal at the second control output to turn off the NMOS FET based on the supply voltage not having collapsed; and set the first control signal at the first control output to turn off the PMOS FET and the second control signal at the second control output to turn on the NMOS FET based on the supply voltage having collapsed.

Aspect 16: The IC of aspect 15, wherein the control circuit further includes an inverter configured to generate the second control signal in response to the supply voltage.

Aspect 17: The IC of aspect 16, wherein the control circuit includes a transmission gate including an input coupled to or serving as the second control input, and an output coupled to an input of the inverter.

Aspect 18: The IC of any one of aspects 15-17, wherein the control circuit further includes a voltage level shifter configured to generate the first control signal in response to the supply voltage and the second control signal.

Aspect 19: A method, including selectively coupling a first drain of a first field effect transistor (FET) to a first gate of the first FET and a second gate of a second FET to effectuate a current mirror operation of the first and second FETs in response to a voltage at the first drain of the first FET.

Aspect 20: The method of aspect 19, wherein selectively coupling the first drain of the first FET to the first and second gates of the first and second FETs, respectively, further includes selectively coupling the first drain of the first FET to the first and second gates of the first and second FETs, respectively, in response to an enable signal.

Aspect 21: The method of aspect 19 or 20, further including generating a current through the second FET based on a supply voltage, wherein selectively coupling the first drain of the first FET to the first and second gates of the first and second FETs, respectively, further includes decoupling the first drain of the first FET from the first and second gates of the first and second FETs in response to the supply voltage collapsing.

Aspect 22: An apparatus, including a first field effect transistor (FET); a second FET: and means for selectively coupling a first drain of the first FET to a first gate of the first FET and a second gate of the second FET to effectuate a current mirror operation of the first and second FETs in response to a voltage at the first drain of the first FET.

Aspect 23: The apparatus of aspect 22, wherein the means for selectively coupling the first drain of the first FET to the first and second gates of the first and second FETs, respectively, includes means for selectively coupling the first drain of the first FET to the first and second gates of the first and second FETs, respectively, in response to an enable signal.

Aspect 24: The apparatus of aspect 22 or 23, further including means for generating a current through the second FET based on a supply voltage, wherein the means for selectively coupling the first drain of the first FET to the first and second gates of the first and second FETs, respectively, includes means for decoupling the first drain of the first FET from the first and second gates of the first and second FETs in response to the supply voltage collapsing.

Aspect 25: A wireless communication device, including: a reference current generator; a bias current receiver coupled to the reference current generator, wherein the bias current receiver includes: a current mirror, including: a first field effect transistor (FET) including a first drain, a first gate, and a first source, wherein the first source is coupled to a first voltage rail; and a second FET including a second drain, a second gate, and a second source, wherein the second gate is coupled to the first gate of the first FET, and the second source is coupled to the first voltage rail; and a selective coupling circuit configured to selectively couple the first drain of the first FET to the first and second gates of the first and second FETs based on a voltage at the first drain of the first FET; and one or more signal processing cores coupled to the bias current receiver.

Aspect 26: The wireless communication device of aspect 25, wherein the selective coupling circuit includes: a third FET including a third source, a third gate, and a third drain, wherein the third source is coupled to the first drain of the first FET; and an inverter coupled between the input and the first voltage rail, wherein the inverter includes an input coupled to the third drain of the third FET and the output, and an output coupled to the third gate of the third FET.

Aspect 27: The wireless communication device of aspect 25 or 26, wherein the selective coupling circuit includes: a second control input configured to receive an enable signal; and a transmission gate coupled between the first drain of the first FET and the first and second gates, wherein the transmission gate is coupled to the second control input.

Aspect 28: The wireless communication device of any one of aspects 25-27, wherein the bias current receiver further includes a third FET coupled in series with the second FET between a second voltage rail and the first voltage rail, and wherein the selective coupling circuit further includes: a control circuit including a first control input coupled to the first drain of the first FET, a second control input coupled to the second voltage rail, and a third control input coupled to the first voltage rail; a first control output, and a second control output; a fourth FET including a fourth source, a fourth gate, and a fourth drain, wherein the fourth source is coupled to the first drain of the first FET, wherein the fourth gate is coupled to the first control output of the control circuit, and wherein the fourth drain is coupled to the first and second gates; and a fifth FET including a fifth drain, a fifth gate, and a fifth source, wherein the fifth drain is coupled to the first and second gates, wherein the fifth gate is coupled to the second control output of the control circuit, and wherein the fifth source is coupled to the first voltage rail.

Aspect 29: An integrated circuit (IC), including: a bias current receiver comprising: a current mirror, including: a first field effect transistor (FET) including a first drain, a first gate, and a first source, wherein the first source is coupled to a first voltage rail, and the first drain is coupled to a current input of the bias current receiver; and a second FET including a second drain, a second gate, and a second source, wherein the second gate is coupled to the first gate of the first FET, and the second source is coupled to the first voltage rail; and a selective coupling circuit configured to selectively couple the first drain of the first FET to the first and second gates of the first and second FETs based on a voltage at the first drain of the first FET.

Aspect 30: The IC of aspect 1, wherein the selective coupling circuit is further configured to selectively couple the first drain of the first FET to the first and second gates of the first and second FETs based on a first enable signal received at a second control input of the selective coupling circuit, wherein a voltage at the first drain of the first FET is received via a first control input of the selective coupling circuit coupled to the current input of the bias current receiver.

Aspect 31: A method, comprising selectively coupling a first drain of a first field effect transistor (FET) to a first gate of the first FET and a second gate of a second FET of a bias current receiver to mirror a first current received at an input of the bias current receiver to produce a mirrored current through the second FET based on a voltage generated at the input of the bias current receiver in response to the first current.

Aspect 32: An apparatus, comprising: a bias current receiver including: a first field effect transistor (FET); a second FET; and means for selectively coupling a first drain of the first FET to a first gate of the first FET and a second gate of the second FET to mirror a first current received at an input of the bias current receiver to produce a mirrored current through the second FET based on a voltage generated at the input of the bias current receiver in response to the first current.

Aspect 33: A wireless communication device, comprising: a reference current generator; a bias current receiver coupled to the reference current generator via a metal trace, wherein the bias current receiver comprises: a current mirror, comprising: a first field effect transistor (FET) including a first drain, a first gate, and a first source, wherein the first source is coupled to a first voltage rail and the first drain is coupled to a current input of the bias current receiver; and a second FET including a second drain, a second gate, and a second source, wherein the second gate is coupled to the first gate of the first FET, and the second source is coupled to the first voltage rail; and a selective coupling circuit having an input coupled to the current input of the bias current receiver and an output coupled to the gates of the first and second FETs, wherein the selective coupling circuit is configured to selectively couple the first drain of the first FET to the first and second gates of the first and second FETs based on a voltage at the first drain of the first FET; and one or more signal processing cores coupled to the bias current receiver.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An integrated circuit (IC), comprising:
   a first field effect transistor (FET) including a first drain, a first gate, and a first source, wherein the first source is coupled to a first voltage rail; and
   a second FET including a second drain, a second gate, and a second source, wherein the second gate is coupled to the first gate of the first FET, and the second drain and the second source are coupled between a second voltage rail and the first voltage rail; and
   a selective coupling circuit configured to:
      decouple the first drain of the first FET from the first and second gates of the first and second FETs based on a supply voltage at the second voltage rail being collapsed;
      decouple the first drain of the first FET from the first and second gates of the first and second FETs based on an enable signal being deasserted, a first voltage at the first drain of the first FET, and the supply voltage at the second voltage rail not being collapsed, wherein the enable signal comprises first and second complementary enable signals; and
      couple the first drain of the first FET to the first and second gates of the first and second FETs based on the enable signal being asserted, and the supply voltage at the second voltage rail not being collapsed, wherein the selective coupling circuit comprises
      a collapse control circuit configured to generate a first control signal based on the collapse of the supply voltage at the second voltage rail,
      a first inverter configured to generate a second control signal based on a second voltage at the first and second gates of the first and second FETs,
      a third FET including a third gate configured to receive the first control signal,
      a fourth FET including a fourth gate coupled to an output of the first inverter,
      a fifth FET including a sixth gate configured to receive the second complementary enable signal, wherein the third, fourth, and fifth FETs are coupled in series between the first drain of the first FET and the first and second gates of the first and second FETs, and
      a sixth FET including a sixth gate configured to receive the first complementary enable signal, wherein the sixth FET is coupled between the first drain of the first FET and the first and second gates of the first and second FETs.

2. The IC of claim 1, wherein the first voltage is in a different voltage domain as the supply voltage at the second voltage rail.

3. The IC of claim 1, wherein the collapse of the supply voltage at the second voltage rail causes a collapse of the first and second complementary enable signals.

4. The IC of claim 1, wherein the third, fourth, and fifth FETs include respective bulks coupled to the first drain of the first FET.

5. The IC of claim 1, wherein the collapse control circuit is configured to generate a third control signal based on the collapse of the supply voltage at the second voltage rail, and wherein the selective coupling circuit further comprises:
   a seventh FET including an seventh gate configured to receive the second complementary enable signal, wherein the seventh FET is coupled between the first and second gates of the first and second FETs and the first voltage rail; and
   an eighth FET including an eighth gate configured to receive the third control signal, wherein the eighth FET is coupled between the first and second gates of the first and second FETs and the first voltage rail.

6. The IC of claim 5, wherein:
   the first, second, sixth, seventh, and eighth FETs each comprises an n-channel metal oxide semiconductor field effect transistor (NMOS FET); and
   the third, fourth, and fifth each comprises a p-channel metal oxide semiconductor field effect transistor (PMOS FET).

7. The IC of claim 5, wherein the collapse control circuit comprises:
   a transmission gate including an input coupled to the second voltage rail, and a first control input coupled to the first voltage rail; and
   a circuit configured to generate the third control signal comprising:
      a ninth FET including a ninth gate coupled to the first voltage rail;
      a diode-connected tenth FET; and
      a second inverter, where the ninth FET, the diode-connected tenth FET, and the second inverter are coupled in series between the first drain of the first FET and the first voltage rail, wherein a node between the diode-connected tenth FET and the second inverter is coupled to a second control input of the transmission gate, wherein the second inverter includes an input coupled to an output of the transmission gate, and wherein the second inverter is configured to generate the third control signal.

8. The IC of claim 7, wherein the transmission gate comprises:
   an eleventh FET including an eleventh gate serving as the first control input of the transmission gate; and
   a twelfth FET including a twelfth gate serving as the second control input of the transmission gate, wherein the eleventh and twelfth FETs are coupled in parallel between the input and output of the transmission gate.

9. The IC of claim 8, wherein:
   the eleventh FET comprises a p-channel metal oxide semiconductor field effect transistor (PMOS FET); and
   the twelfth FET comprises an n-channel metal oxide semiconductor field effect transistor (NMOS FET).

10. The IC of claim 7, wherein the second inverter comprises:
    an eleventh FET; and
    a twelfth FET coupled in series with the eleventh FET between the diode-connected tenth FET and the first voltage rail, wherein the eleventh and twelfth FETs include gates and drains coupled together and serving as the input and output of the second inverter, respectively.

11. The IC of claim 10, wherein:
the eleventh FET comprises a p-channel metal oxide semiconductor field effect transistor (PMOS FET); and
the twelfth FET comprises an n-channel metal oxide semiconductor field effect transistor (NMOS FET).

12. The IC of claim 7, wherein the collapse control circuit further comprises a circuit configured to generate the first control signal comprising:
an eleventh FET including an eleventh gate;
a diode-connected twelfth FET including a twelfth gate;
a thirteenth FET including a thirteenth gate coupled to an output of the transmission gate, wherein the eleventh FET, the diode-connected twelfth FET, and the thirteenth FET are coupled in series between the first drain of the first FET and the first voltage rail;
a fourteenth FET including a fourteenth gate coupled to the gate of the diode-connected twelfth FET;
a diode-connected fifteenth FET including a fifteenth gate coupled to the eleventh gate of the eleventh FET;
a sixteenth FET including a sixteenth gate configured to receive the third control signal, wherein the fourteenth FET, the diode-connected fifteenth FET, and the sixteenth FET are coupled in series between the first drain of the first FET and the first voltage rail;
a seventeenth FET including a seventeenth gate coupled to a node between the fourteenth FET and the diode-connected fifteenth FET; and
an eighteenth FET including an eighteenth gate coupled to a node between the diode-connected fifteenth FET and the sixteenth FET, wherein the seventeenth FET and eighteenth FET are coupled in series between the first drain of the first FET and the first voltage rail, and wherein a node between the seventeenth FET and the eighteenth FET is configured to produce the first control signal.

13. The IC of claim 12, wherein:
the eleventh FET, the diode-connected twelfth FET, the fourteenth FET, the diode-connected fifteenth, and the seventeenth FET each comprises a p-channel metal oxide semiconductor field effect transistor (PMOS FET); and
the thirteenth FET, the sixteenth FET, and the eighteenth FET each comprises an n-channel metal oxide semiconductor field effect transistor (NMOS FET).

14. The IC of claim 1, wherein the first inverter comprises:
a seventh FET including a seventh gate coupled to the first and second gates of the first and second FETs;
an eighth FET including an eighth gate coupled to the first and second gates of the first and second FETs, wherein a node between the seventh FET and the eighth FET is configured to produce the second control signal; and
a ninth FET including a ninth gate configured to receive the first complementary enable signal, wherein the seventh FET, the eighth FET, and the ninth FET are coupled in series between the first drain of the first FET and the first voltage rail.

15. The IC of claim 14, wherein the seventh FET includes a bulk coupled to the first drain of the first FET.

16. The IC of claim 14, wherein:
the seventh FET comprises a p-channel metal oxide semiconductor field effect transistor (PMOS FET); and
the eighth FET and the ninth FET each comprises an n-channel metal oxide semiconductor field effect transistor (NMOS FET).

17. The IC of claim 1, further comprising a reference current generator configured to generate a reference current that produces the first voltage at the first drain of the first FET.

18. The IC of claim 17, further comprising a third FET coupled in series with the second FET between the second voltage rail and the first voltage rail, wherein the third FET is configured to generate a mirrored current based on the reference current.

19. The IC of claim 18, further comprising a set of one or more FETs coupled to the third FET, wherein the set of one or more FETs are configured to generate a set of one or more bias currents based on the mirrored current.

20. The IC of claim 19, further comprising a set of one or more signal processing cores configured to generate and/or process one or more baseband signals based on the set of one or more bias currents.

21. The IC of claim 20, further comprising a transceiver coupled to the set of one or more signal processing cores.

22. An integrated circuit (IC), comprising:
a first field effect transistor (FET) including a first drain, a first gate, and a first source, wherein the first source is coupled to a first voltage rail; and
a second FET including a second drain, a second gate, and a second source, wherein the second gate is coupled to the first gate of the first FET, and the second drain and the second source are coupled between a second voltage rail and the first voltage rail; and
a selective coupling circuit coupled between the first drain of the first FET and the first and second gates of the first and second FETs, wherein the selective coupling circuit comprises:
a set of FETs coupled in series between the first drain of the first FET and the first and second gates of the first and second FETs;
an inverter including an input coupled to the first and second gates of the first and second FETs, and an output coupled to a gate of one of the set of FETs;
a collapse control circuit including an input coupled to the second voltage rail and a first control output coupled to a gate of another of the set of FETs, wherein a gate of yet another one of the set of FETs is configured to receive a first enable signal.

23. The IC of claim 22, wherein the first drain of the first FET is configured to receive a current generated based on a first voltage domain, wherein a supply voltage at the second voltage rail is in a second voltage domain different than the first voltage domain.

24. The IC of claim 22, wherein the selective coupling circuit further comprises:
a third FET coupled in parallel with the set of FETs, wherein the third FET includes a third gates configured to receive a second enable signal complementary to the first enable signal;
a fourth FET coupled between the first and second gates of the first and second FETs and the first voltage rail, wherein the fourth FET includes a fourth gate configured to receive the first enable signal; and
a fifth FET coupled between the first and second gates of the first and second FETs and the first voltage rail, wherein the fifth FET includes a fifth gate coupled to a second control output of the collapse control circuit.

* * * * *